United States Patent
Fujiki

(10) Patent No.: US 7,843,740 B2
(45) Date of Patent: Nov. 30, 2010

(54) METHOD FOR DRIVING A NONVOLATILE SEMICONDUCTOR MEMORY DEVICE

(75) Inventor: Jun Fujiki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 12/268,648

(22) Filed: Nov. 11, 2008

(65) Prior Publication Data

US 2009/0244984 A1 Oct. 1, 2009

(30) Foreign Application Priority Data

Mar. 31, 2008 (JP) .............................. 2008-089872

(51) Int. Cl.
*G11C 11/34* (2006.01)
(52) U.S. Cl. ............................. 365/185.26; 365/185.25; 365/185.01; 365/185.14; 365/182; 365/180
(58) Field of Classification Search ............ 365/185.26, 365/185.25, 185.01, 185.14, 182, 180; 257/315, 257/314, 316.3, 71
See application file for complete search history.

(56) References Cited

U.S. PATENT DOCUMENTS

| 6,295,229 | B1 * | 9/2001 | Chang et al. ............ 365/185.28 |
| 2005/0006698 | A1 | 1/2005 | Matsuzaki et al. | |

FOREIGN PATENT DOCUMENTS

| JP | 2007-35214 | 2/2007 |
| JP | 2007-115407 | 5/2007 |
| JP | 2007-193862 | 8/2007 |

OTHER PUBLICATIONS

U.S. Appl. No. 12/405,626, filed Mar. 17, 2009, Shingu, et al.
Tomoharu Tanaka, et al., "A Quick Intelligent Program Architecture for 3V-only NAND-EEPROMs", Symposium on VLSI Circuits Digest of Technical Papers, Jun. 1992, pp. 20-21.
Hitoshi Kume, et al., "A 1.28 µ m² Contactless Memory Cell Technology for a 3V-Only 64Mbit EEPROM", IEDM Tech. Dig., Dec. 1992, pp. 991-993.

(Continued)

*Primary Examiner*—Thong Q Le
(74) *Attorney, Agent, or Firm*—Oblon, Spivak, McClelland, Maier & Neustadt, L.L.P.

(57) ABSTRACT

A method for driving a nonvolatile semiconductor memory device is provided. The nonvolatile semiconductor memory device includes a semiconductor layer having a channel, a first insulating film provided on the channel, a floating electrode provided on the first insulating film, a second insulating film provided on the floating electrode, and a gate electrode provided on the second insulating film, and changes its data memory state by injection of charges into the floating electrode. The method includes to achieve a state in which charges having a first polarity are injected into the floating electrode: providing a first potential difference between the semiconductor layer and the gate electrode to inject charges having the first polarity into the second insulating film; subsequently providing a second potential difference between the semiconductor layer and the gate electrode to inject charges having a second polarity opposite to the first polarity into the second insulating film; and subsequently providing a third potential difference between the semiconductor layer and the gate electrode to inject charges having the first polarity into the floating electrode.

21 Claims, 15 Drawing Sheets

OTHER PUBLICATIONS

H. Onoda, et al., "A Novel cell Structure suitable for a 3 volt operation, Sector erase Flash Memory", IEDM Tech. Dig., Dec. 1992, pp. 599-602.

Gheorghe Samachisa, et al., "A 128K Flash EEPROM Using Double-Polysilicon Technology", IEEE Journal of Solid-State Circuits, vol. SC-22, No. 5, Oct. 1987, pp. 676-683.

Virgil Niles Kynett, et al., "An In-System Reprogrammable 256K CMOS Flash Memory", ISSCC Dig. Tech. Papers, Feb. 1988, 3 pages.

Fujio Masouka, et al., "A new flash $E^2PROM$ Cell Using Triple Polysilicon Technology", IEDM Tech. Dig., Dec. 1984, pp. 464-467.

U.S. Appl. No. 12/053,108, filed Mar. 21, 2008, Jun Fujiki.

* cited by examiner

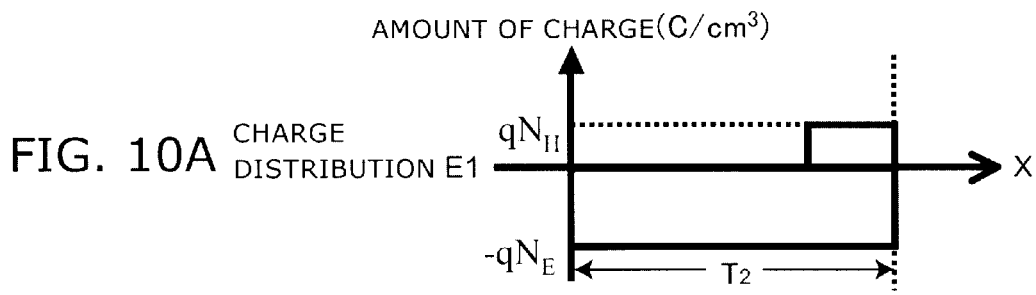
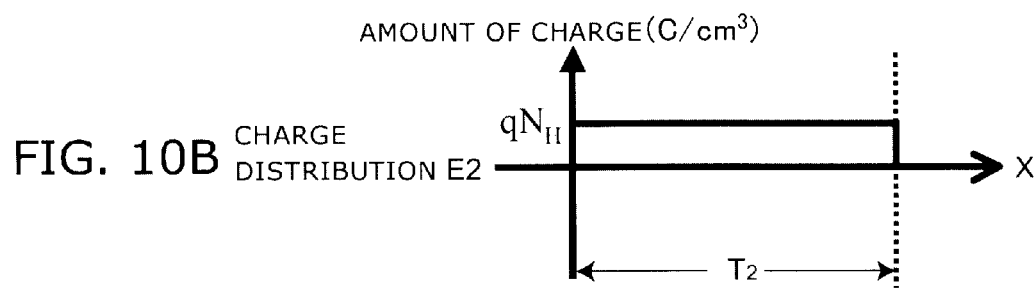
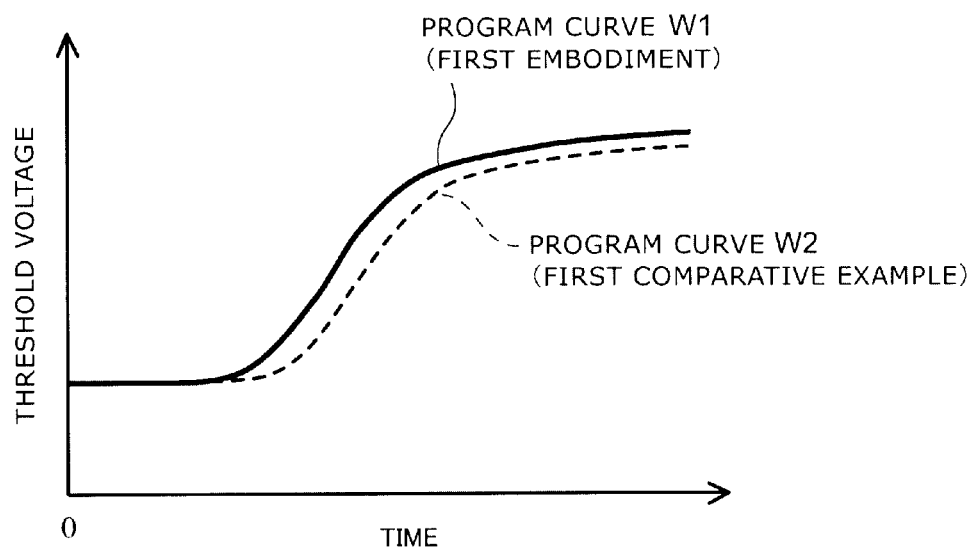
FIG. 11

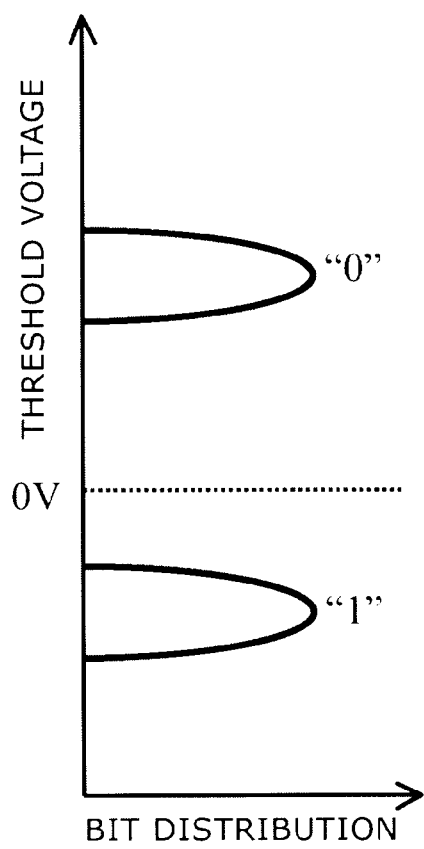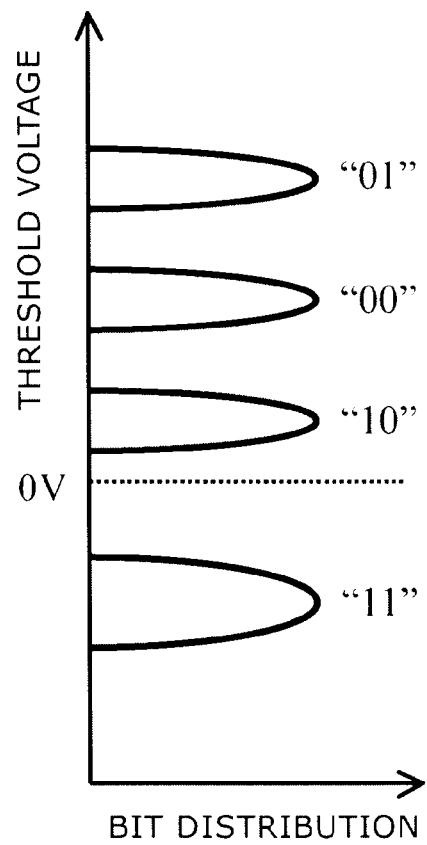
FIG. 12A                    FIG. 12B

METHOD FOR DRIVING A NONVOLATILE SEMICONDUCTOR MEMORY DEVICE

CROSS-REFERENCE TO RELATED APPLICATIONS

This application is based upon and claims the benefit of priority from the prior Japanese Patent Application No. 2008-089872, filed on Mar. 31, 2008; the entire contents of which are incorporated herein by reference.

BACKGROUND OF THE INVENTION

1. Field of the Invention

This invention relates to a method for driving a nonvolatile semiconductor memory device based on transistor type memory cells having a floating electrode.

2. Background Art

With the recent progress of downscaling, a NAND flash memory having a floating gate has an increasing need to decrease an electrical film thickness of an insulating film bearing charge retention. This raises a problem of releasing charge stored in a floating gate by decreasing the electrical film thickness to cause degradation of retention characteristics of threshold voltage. Moreover, there is a tendency to use a high dielectric material as a part of the insulating film with the purpose of decreasing the electrical film thickness of the insulating film. The high dielectric material is highly defective and has characteristics trapping charges. Charges trapped by the high dielectric material affect the threshold voltage, and thus release of trapped charges with time results in the degradation of the retention characteristics of the threshold voltage.

To avoid problems specifically arising in such a floating gate flash memory having the high dielectric material, a method for injecting charges favorable to a charge trapping characteristics of the insulating film has been investigated.

For example, US Patent Application Publication No. 2005/0006698 discloses a technology enhancing charge retention characteristics and improving the reliability by performing a program operation on all memory cells existing in an erase unit before applying an erase bias, thereafter applying the erase bias.

JP-A 2007-35214 (Kokai) discloses a technology assuring a read margin to improve the reliability of the operation by applying a lower voltage than a semiconductor substrate to a control gate and de-trapping charges trapped near an oxide film or an interface between an oxide film and the semiconductor substrate.

On the other hand, also in a MONOS (Metal-Oxide-Nitride-Oxide-Semiconductor) nonvolatile memory device, it has been possible to enhance the retention characteristic and speed up a program and erase operation by controlling positions of charges in the insulating film.

However, in a floating gate flash memory, the enough investigation has not been performed about performance enhancement by control of charge trapping in the insulating film, particularly a block insulating film, and a method for driving necessary for enhancement of the retention characteristics focusing attention on the block insulating film and speed up of the program and erase operation has not been proposed.

SUMMARY OF THE INVENTION

According to an aspect of the invention, there is provided a method for driving a nonvolatile semiconductor memory device having a semiconductor layer having a channel and source/drain regions provided on both sides of the channel, a first insulating film provided on the channel, a floating electrode provided on the first insulating film, a second insulating film provided on the floating electrode, and a gate electrode provided on the second insulating film, the nonvolatile semiconductor memory device changing its data memory state by injection of charges into the floating electrode, the method including, to achieve a state in which charges having a first polarity are injected into the floating electrode: providing a first potential difference between the semiconductor layer and the gate electrode to inject charges having the first polarity into the second insulating film; subsequently providing a second potential difference between the semiconductor layer and the gate electrode to inject charges having a second polarity opposite to the first polarity into the second insulating film; and subsequently providing a third potential difference between the semiconductor layer and the gate electrode to inject charges having the first polarity into the floating electrode.

According to another aspect of the invention, there is provided a method for driving a nonvolatile semiconductor memory device having a semiconductor layer having a channel and source/drain regions provided on both sides of the channel, a first insulating film provided on the channel, a floating electrode provided on the first insulating film, a second insulating film provided on the floating electrode, and a gate electrode provided on the second insulating film, the nonvolatile semiconductor memory device changing its data memory state by injection of charges into the floating electrode, the method including, to achieve a state in which charges having a first polarity are injected into the floating electrode: providing a fifth potential difference between the semiconductor layer and the gate electrode to inject charges having the first polarity into the floating electrode; and subsequently providing a sixth potential difference between the semiconductor layer and the gate electrode to inject charges having a second polarity opposite to the first polarity into the second insulating film.

According to another aspect of the invention, there is provided a nonvolatile semiconductor memory device including: a semiconductor layer having a channel and source/drain regions provided on both sides of the channel; a first insulating film provided on the channel; a floating electrode provided on the first insulating film; a second insulating film provided on the floating electrode; a gate electrode provided on the second insulating film; and a control circuit controlling its data memory state by injection of charges into the floating electrode, the control circuit being configured to perform, to achieve a state in which charges having a first polarity are injected into the floating electrode: providing a first potential difference between the semiconductor layer and the gate electrode to inject charges having the first polarity into the second insulating film; subsequently providing a second potential difference between the semiconductor layer and the gate electrode to inject charges having a second polarity opposite to the first polarity into the second insulating film; and subsequently providing a third potential difference between the semiconductor layer and the gate electrode to inject charges having the first polarity into the floating electrode.

According to another aspect of the invention, there is provided a nonvolatile semiconductor memory device including: a semiconductor layer having a channel and source/drain regions provided on both sides of the channel; a first insulating film provided on the channel; a floating electrode provided on the first insulating film; a second insulating film provided on the floating electrode; a gate electrode provided on the second insulating film; and a control circuit controlling its data memory state by injection of charges into the floating electrode, the control circuit being configured to perform, to achieve a state in which charges having a first polarity are injected into the floating electrode: providing a fifth potential difference between the semiconductor layer and the gate electrode to inject charges having the first polarity into the floating electrode; and subsequently providing a sixth potential difference between the semiconductor layer and the gate electrode to inject charges having a second polarity opposite to the first polarity into the second insulating film.

BRIEF DESCRIPTION OF THE DRAWINGS

FIGS. 10A and 10B are graphs illustrating charge distribution formed by application of the method according to the first embodiment of the invention and the method of the comparative example;

FIG. 11 is a graph illustrating the temporal variations of threshold voltage by the method according to the first embodiment and the method of the first comparative example;

FIGS. 12A and 12B are graphs illustrating threshold distributions of the nonvolatile semiconductor memory device to which the method according to the first embodiment is applied;

DETAILED DESCRIPTION OF THE INVENTION

Embodiments of the invention will now be described with reference to the drawings.

First Embodiment

Figure 1:
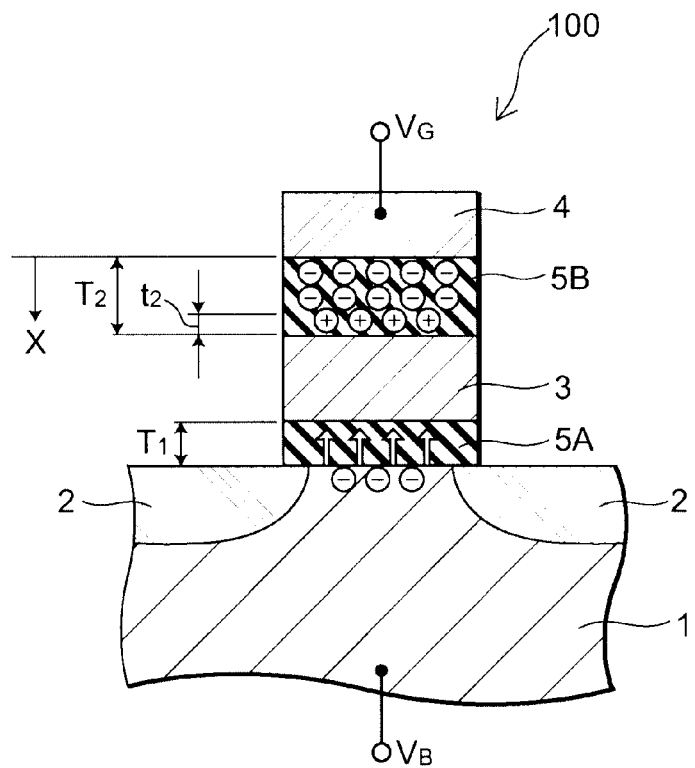
FIG. 1 is a schematic cross-sectional view illustrating charge distribution formed by application of a method according to a first embodiment of the invention.

FIG. 1 is a schematic cross-sectional view illustrating charge distribution formed by application of a method for driving a nonvolatile semiconductor memory device according to a first embodiment of the invention.

Figure 2:
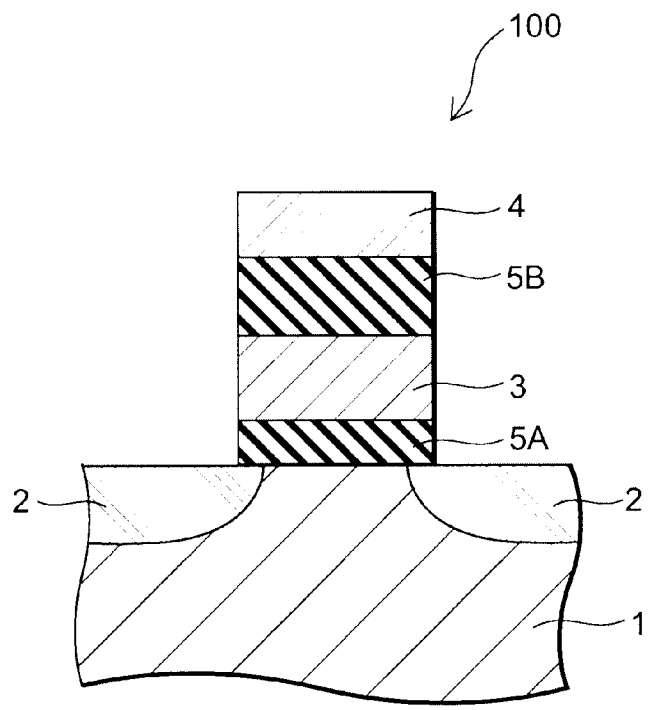
FIG. 2 is a schematic cross-sectional view illustrating the structure of a nonvolatile semiconductor memory device to which the method according to the first embodiment is applied.

FIG. 2 is a schematic cross-sectional view illustrating the structure of a nonvolatile semiconductor memory device to which the method for driving the nonvolatile semiconductor memory device according to the first embodiment of the invention is applied.

With regard to this specification, FIG. 2 and the following respective figures, the same components as those described above with reference to previous figures are marked with the same reference numerals and not described in detail.

As shown in FIG. 2, a nonvolatile semiconductor memory device 100 to which the method for driving the nonvolatile semiconductor memory device according to the first embodiment of the invention is applied has a floating gate memory cell.

The nonvolatile semiconductor memory device 100 has a structure which a first insulating film (tunnel insulating film) 5A, a floating gate (floating electrode) 3, a second insulating film (block insulating film) 5B and a gate electrode 4 are laminated on a semiconductor layer 1 in this order. And source/drain regions 2 are formed by introducing N-type impurities into the semiconductor layer 1 by ion implantation or the like using the gate electrode 4 as a mask. That is, the nonvolatile semiconductor memory device 100 includes the source/drain regions 2 spaced from each other in a surface portion of the semiconductor layer 1, the first insulating film 5A provided on a channel between the source/drain regions 2, the floating electrode 3 provided on the first insulating film 5A, the second insulating film 5B provided on the floating electrode 3 and the gate electrode 4 provided on the second insulating film 5B.

Since the floating electrode 3 is surrounded by the first insulating film 5A and the second insulating film 5B, charges injected into the floating electrode 3 are retained. That is, the nonvolatile semiconductor memory device 100 changes the data memory state by injecting charges into the floating electrode 3.

The semiconductor layer 1 can be illustratively based on a semiconductor layer doped with P-type impurities. The semiconductor layer 1 may includes a P-type well, a P-type semiconductor layer (e.g. SOI (silicon on insulator) layer), and a P-type polysilicon layer and the like.

Furthermore, while the nonvolatile semiconductor memory device 100 is taking an N-channel floating gate memory cell as an example, the invention is not limited to the N-channel type, but is also applicable to the P-channel type. Since the latter case can be addressed by reversing the polarity of impurities in the source/drain regions 2 and the semiconductor layer 1 and exchanging the voltages applied to the semiconductor layer 1 and the gate electrode 4, the P-channel type is not described.

The floating electrode 3 can be based on semiconductor materials such as silicon (Si), germanium (Ge), GaAs, InP or metal materials such as Ti, Ta, Au, Al, Mo. Moreover, when a polysilicon layer is used for the floating electrode 3, in addition to a layer configuration of one sheet, for example, a two or three layers configuration may be used. The floating electrode 3 may be based on not only a layer configuration but also a nanocrystal.

The first insulating film 5A and the second insulating film 5B can be based on various materials, including silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$).

It is noted that the second insulating film 5B is an insulating film between the floating electrode 3 and the gate electrode 4 and has a function to block a charge flow between the floating electrode 3 and the gate electrode 4. However, this block function is not necessarily perfect, but may limit the charge flow between the floating electrode 3 and the gate electrode 4.

Figure 3:
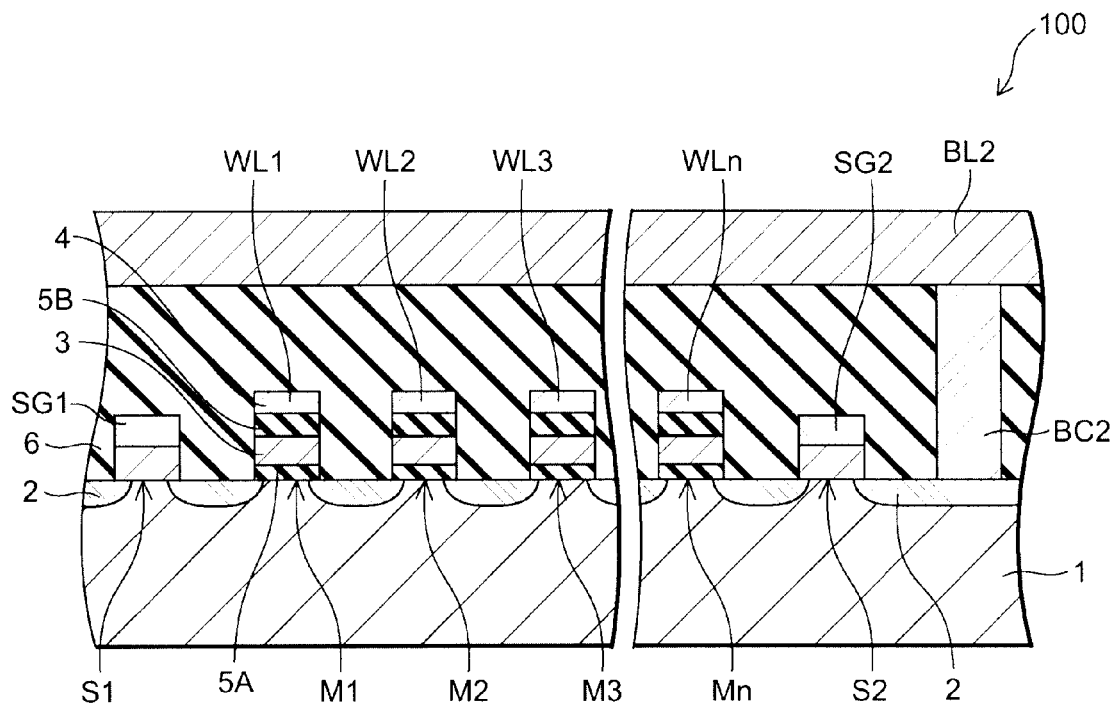
FIG. 3 is a schematic cross-sectional view in a column direction illustrating the nonvolatile semiconductor memory device to which the method according to the first embodiment of is applied.

FIG. 3 is a schematic cross-sectional view in a column direction illustrating the nonvolatile semiconductor memory device to which the method for driving the nonvolatile semiconductor memory device according to the first embodiment of the invention is applied.

As shown in FIG. 3, in the nonvolatile semiconductor memory device 100 to which the method for driving the nonvolatile semiconductor memory device according to the first embodiment of the invention is applied, a plurality of floating gate memory cells (M1-Mn) are arranged on the semiconductor layer 1. The gate electrode 4 of each memory cell is in electrical contact with an adjacent NAND string and referred to as word lines WL1-WLn. The source/drain region 2 is formed in the surface of the semiconductor layer 1 below the portion between the word lines WL1-WLn.

A first select transistor S1 and a second select transistor S2 are made of a normal MOSFET (Metal Oxide Semiconductor Field Effect Transistor). The gate electrodes of the first and second select transistors S1, S2 constitute a first select gate SG1 and a second select gate SG2, respectively.

An interlayer insulating film 6 (e.g. silicon dioxide) is thickly deposited on these floating gate memory cells M1-Mn and the first and second select transistors S1, S2.

A bit line BL2 is connected through a bit contact BC2 to the source/drain region 2 adjacent to the second select transistor S2. Likewise, a bit line BL1 is connected through a bit contact BC1 to the source/drain region 2 adjacent to the first select transistor S1. The bit contact BC1 and the bit line BL1 are not shown.

Figure 4:
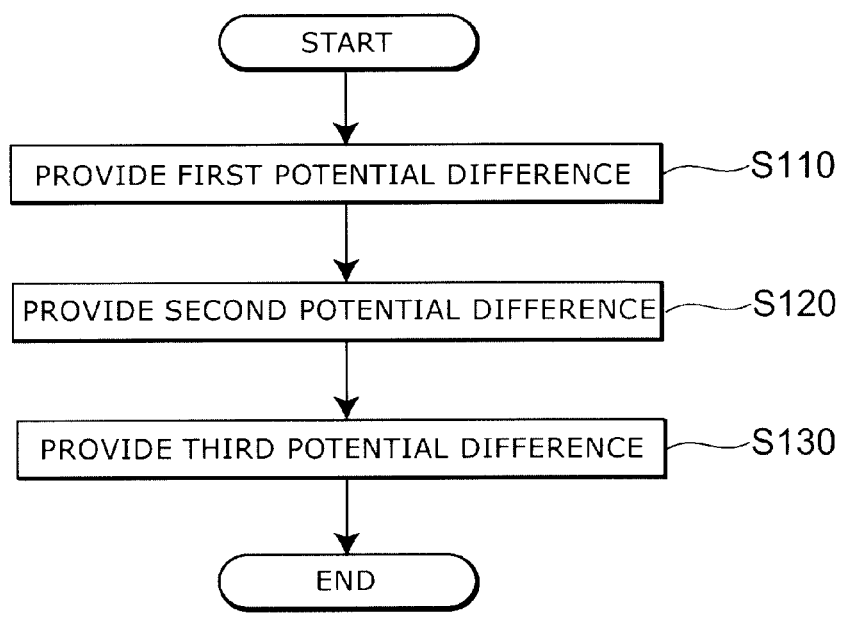
FIG. 4 is a flow chart illustrating the method according to the first embodiment.

FIG. 4 is a flow chart illustrating the method for driving the nonvolatile semiconductor memory device according to the first embodiment of the invention.

As shown in FIG. 4, in the method for driving the nonvolatile semiconductor memory device according to the first embodiment of the invention, first, a first potential difference is provided between the semiconductor layer 1 and the gate electrode 4 (step S110). It is noted that this semiconductor layer 1 and the gate electrode 4 are the semiconductor layer 1 and the gate electrode 4 of the nonvolatile semiconductor memory device 100 as described above. This first potential difference injects charges having a first polarity into the second insulating film 5B.

Next, a second potential difference is provided between the semiconductor layer 1 and the gate electrode 4 (step S120). This second potential difference injects charges having a second polarity opposite to the first polarity into the second insulating film 5B.

Next, a third potential difference is provided between the semiconductor layer 1 and the gate electrode 4 (step S130). This third potential difference injects charges having the first polarity into the floating electrode 3.

This enables a charge distribution in the second insulating film 5B to be electrically controlled, a program and erase operation to be speeded up.

Figure 5:
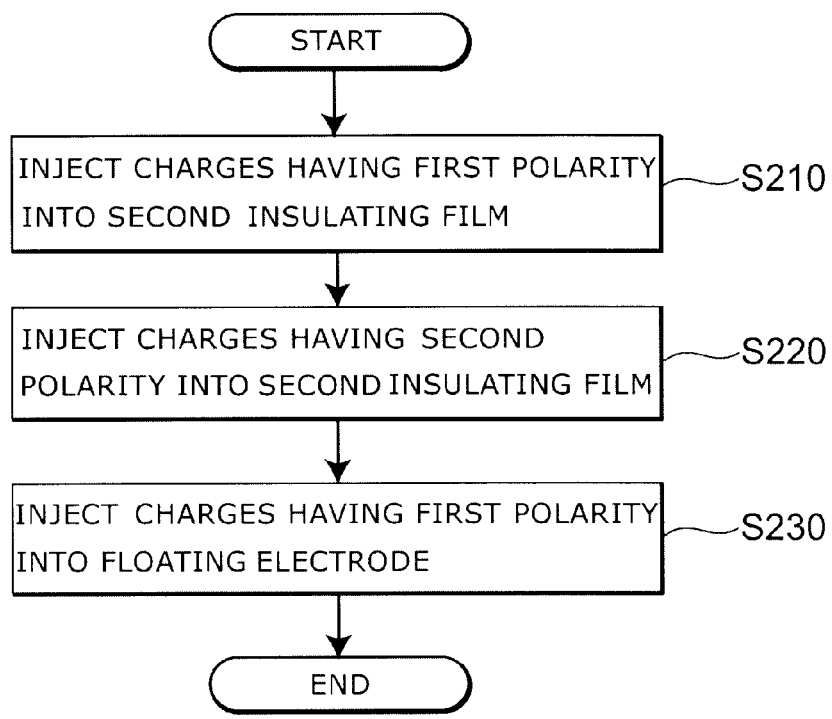
FIG. 5 is another flow chart illustrating the method according to the first embodiment.

FIG. 5 is another flow chart illustrating the method for driving the nonvolatile semiconductor memory device according to the first embodiment of the invention.

In the method for driving the nonvolatile semiconductor memory device according to the first embodiment of the invention, first, charges having the first polarity are injected into the second insulating film 5B (step S210).

Next, charges having the second polarity opposite to the first polarity are injected into the second insulating film 5B (step S220).

Next, charges having the first polarity are injected into the floating electrode 3 (step S230).

This enables the charge distribution in the second insulating film 5B to be electrically controlled, the program and erase operation to be speeded up.

That is, it can be set that the first polarity is negative, the first potential difference is a potential difference such that the gate electrode 4 has a higher potential than the semiconductor layer 1, the second potential difference is a potential difference such that the gate electrode 4 has a lower potential than the semiconductor layer 1 and the third potential difference is a potential difference such that the gate electrode 4 has a higher potential than the semiconductor layer 1.

Moreover, it can be set that the first polarity is positive, the first potential difference is a potential difference such that the gate electrode 4 has a lower potential than the semiconductor layer 1, the second potential difference is a potential difference such that the gate electrode 4 has a higher potential than the semiconductor layer 1 and the third potential difference is a potential difference such that the gate electrode 4 has a lower potential than the semiconductor layer 1.

It is noted that electrons flow from a portion with a lower potential to a portion with a higher potential, and holes flow from a portion with a higher potential to a portion with a lower potential.

In the following, the case where the first polarity is the negative polarity and the second polarity is the positive polarity, namely, the case where electrons are injected into the floating electrode (floating gate) 3 in the above step 230 is described. Here, in the following, the description is made by taking the data program operation as injection of electrons into the floating electrode 3 and taking the data erase operation as injection of holes into the floating electrode 3.

Figure 6:
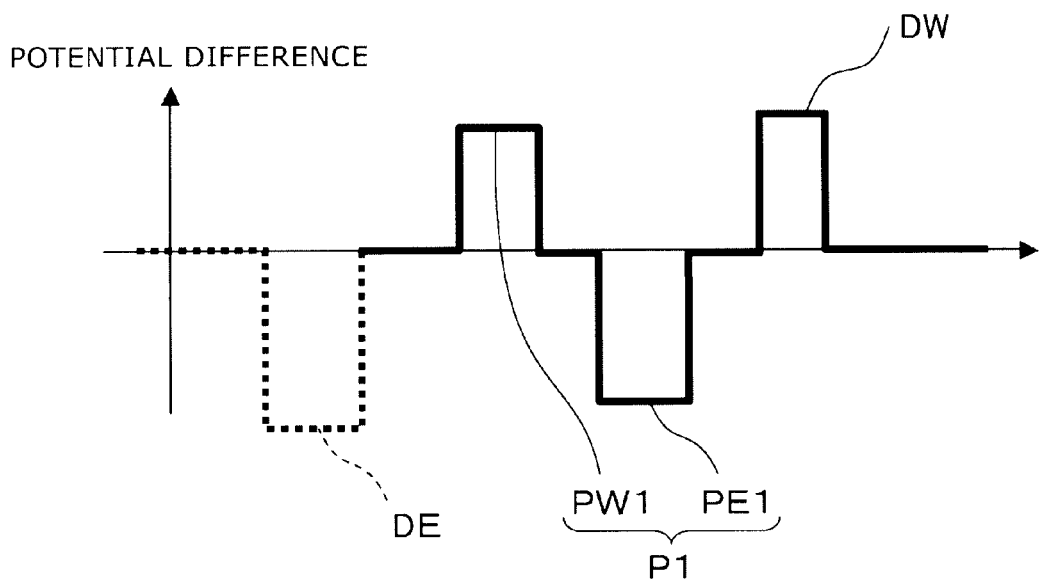
FIG. 6 is a graph illustrating the method according to the first embodiment.

FIG. 6 is a graph illustrating the method for driving the nonvolatile semiconductor memory device according to the first embodiment of the invention.

FIG. 6 illustrates the case where electrons are injected into the floating electrode 3 as the data program operation. The horizontal axis of the figure represents the time and the vertical axis represents the potential difference between the semiconductor layer 1 and the gate electrode 4.

As shown in FIG. 6, in the method for driving the nonvolatile semiconductor memory device of this embodiment, after the first potential difference for a preliminary program operation PW1 is provided between the semiconductor layer 1 and the gate electrode 4 of the nonvolatile semiconductor memory device 100 (step S110, step S210), the second potential difference for a preliminary erase operation PE1 is provided (step S120, step S220), thereafter the third potential difference for a data program operation DW is provided (step S130, step S230). Here, the first potential difference and the third potential difference are assumed to have the same polarity and to have the positive polarity. The second potential difference has the negative polarity. That is, the polarity of charges injected and the polarity of the potential difference provided therefor are opposite each other.

That is, the first polarity is the negative polarity, the first potential difference (preliminary program operation PW1) is provided by application of a voltage higher than a voltage applied to the semiconductor layer 1 to the gate electrode 4, the second potential difference (preliminary erase operation PE1) is provided by application of a voltage lower than a voltage applied to the semiconductor layer 1 to the gate electrode 4, and the third potential difference (data program operation DW) is provided by application of a voltage higher than a voltage applied to the semiconductor layer 1 to the gate electrode 4.

It is noted that, as shown in FIG. 6, the normal data erase operation DE may be performed before the above preliminary program operation PW1.

Thus, as shown in FIG. 1, in the nonvolatile semiconductor memory device 100 before the data program operation DW (step S130, step S230), defects in the region of the side near the gate electrode 4 in the second insulating film 5B are filled with electrons and defects in the region near the floating electrode 3 in the second insulating film 5B are filled with holes.

The sequence of operations including the above preliminary program operation PW1 and the preliminary erase operation PE1 is hereinafter referred to as preset P1.

FIGS. 7A to 7D are schematic cross-sectional views illustrating the temporal variation of charge distribution formed by application of the method for driving the nonvolatile semiconductor memory device according to the first embodiment of the invention.

Figure 7A:
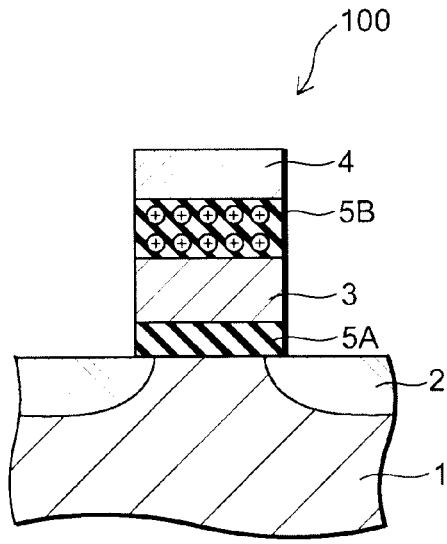
FIGS. 7A to 7D are schematic cross-sectional views illustrating the temporal variation of charge distribution formed by application of the method according to the first embodiment.
Figure 7B:
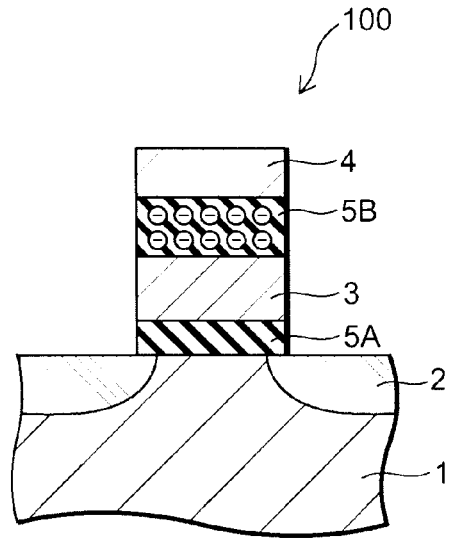
Figure 7C:
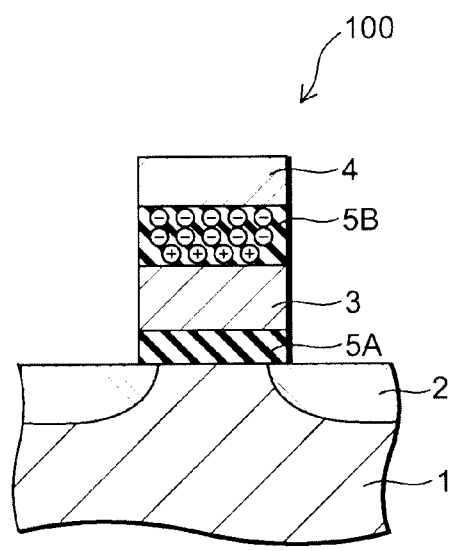
Figure 7D:
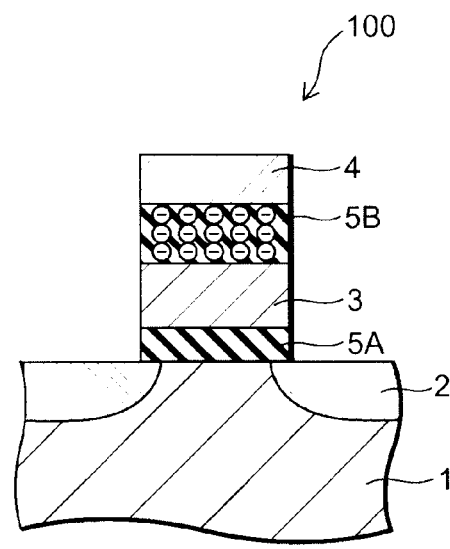

FIG. 7A shows the initial state, FIG. 7B shows the state after the preliminary program operation PW1, FIG. 7C shows the state after the preliminary erase operation PE1 and FIG. 7D shows the state after the data program operation DW.

And the figures illustrate the electron injection into the floating electrode 3 as the data program operation.

As shown in FIG. 7A, the initial state of the method for driving the nonvolatile semiconductor memory device of this embodiment is, for example, a state after the execution of the normal data ease operation DE, and the defects in the second insulating film 5B are filled with holes.

And as shown in FIG. 7B, the defects in the second insulating film 5B are filled with electrons after the preliminary program operation PW1. That is, electrons are injected from the semiconductor layer 1 into the floating electrode 3 by the preliminary program operation PW1. Some of electrons injected into the floating electrode 3 pass through the floating electrode 3 and are injected into the second insulating film 5B, and then discrete traps (defects) in the second insulating film 5B are filled with electrons.

And as shown in FIG. 7C, the following preliminary erase operation PE1 causes defects in a partial region of the second insulating film 5B facing the floating electrode 3 to capture holes. That is, holes are injected from the semiconductor layer 1 into the floating electrode 3 by the preliminary erase operation PE1. Some of holes injected into the floating electrode 3 pass through the floating electrode 3 and are injected into the second insulating film 5B, and then holes are captured by some of discrete traps existing in the second insulating film 5B filled with electrons. Specifically, the holes are captured near the interface in the second insulating film 5B facing the floating electrode 3.

By the above preset 1 (preliminary program operation PW1 and preliminary erase operation PE1), the charge distribution illustrated in FIG. 7C and FIG. 1 is formed in the second insulating film 5B. More specifically, the formed charge distribution is such that electrons are captured near the interface of the second insulating film 5B with the gate electrode 4 and holes are captured near the interface with the floating electrode 3.

After this state is formed, the data program operation DW is performed and electrons are injected into the floating electrode 3, as shown in FIG. 7D.

It is noted that, in the above, as illustrated in FIG. 7C, in the preliminary erase operation PE1, holes are injected into only the region of the second insulating film 5B facing the floating electrode 3 and not injected into the whole region of the second insulating film 5B. More specifically, all discrete traps (defects) in the second insulating film 5B are not completely filled with holes.

This enables the defects in the region near the gate electrode 4 in the second insulating film 5B to be filled with electrons and the defects in the region near the floating electrode 3 in the second insulating film 5B to be filled with holes before the data program operation DW. If the electron injection is performed by the data program operation DW after this state is formed, since the defects in the second insulating film 5B are virtually filled with electrons, provision of electrons into the second insulating film 5B is not necessary except making up for a shortage of electrons in the second insulating film 5B near the floating electrode 3, and thus the program operation is completed instantaneously. That is, the data program operation DW can be substantially speeded up.

At this time, for omission of the preliminary erase operation PE1 after the preliminary program operation PW1, the floating electrode 3 is filled with electrons and the state before the data program operation DW to be followed thereafter is not the data erased state. On the contrary, like the method for driving the nonvolatile semiconductor memory device according to this embodiment, performing the preliminary erase operation PE1 after the preliminary program operation PW1 causes the floating electrode 3 to be in the data erased state. This enables the data program operation DW to be performed on the data erased state and thus a stable operation can be achieved.

As described above, in the method for driving the nonvolatile semiconductor memory device of this embodiment, charges are injected into the second insulating film 5B and at least some of the charges are captured by the second insulating film 5B, and consequently the charge injection into the floating electrode 3 can be accelerated. That is, this can improve the efficiency of the data program operation DW.

First Comparative Example

Figure 8:
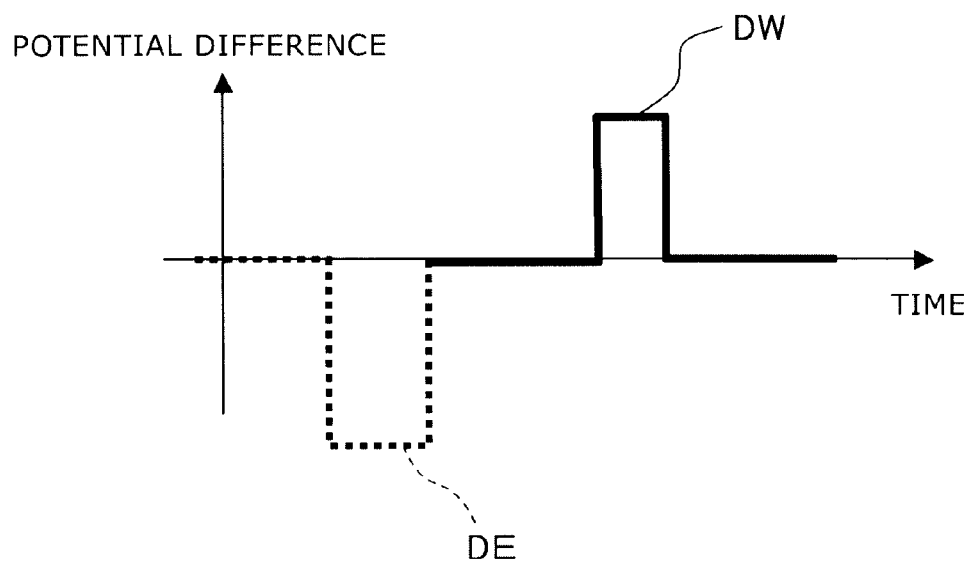
FIG. 8 is a graph illustrating a method according to an embodiment of a first comparative example.

FIG. 8 is a graph illustrating a method for driving a nonvolatile semiconductor memory device according to an embodiment of a first comparative example.

FIG. 8 illustrates a case where electrons are injected into the floating electrode 3 as the data program operation.

As shown in FIG. 8, in the method for driving the nonvolatile semiconductor memory device of the first comparative example, only the third potential difference for the data program operation DW is provided. More specifically, the method for driving the nonvolatile semiconductor memory device of the first comparative example does not include the step S110 and the step S120 illustrated in FIG. 4, namely, does not include the step S210 and the step S220 illustrated in FIG. 5.

Incidentally, the above data program operation DW is preceded by the normal data erase operation DE.

Figures 9A, 9B:
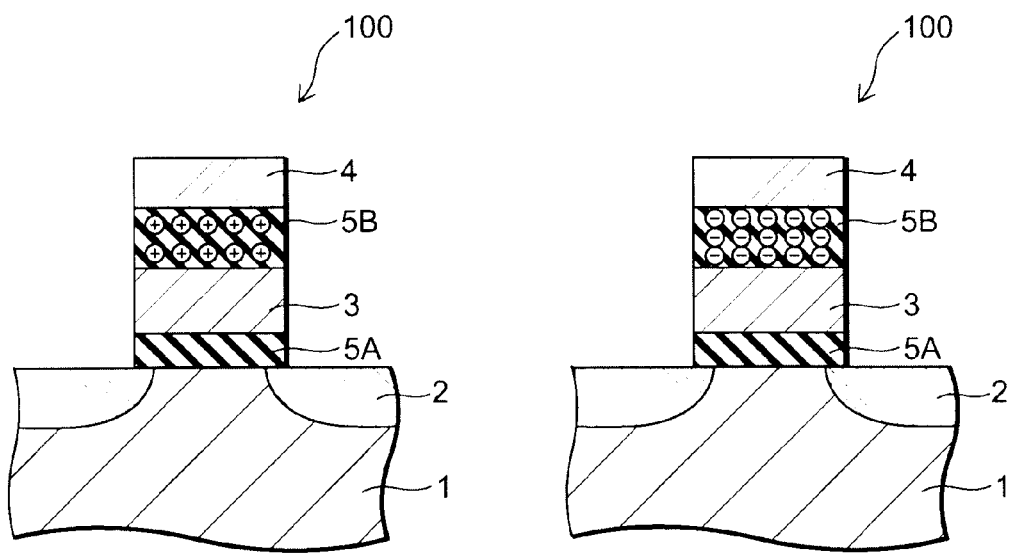
FIGS. 9A and 9B are schematic cross-sectional views illustrating the temporal variation of charge distribution of the device formed by application of the method of the first comparative example.

FIGS. 9A and 9B are schematic cross-sectional views illustrating the temporal variation of charge distribution of the nonvolatile semiconductor memory device formed by application of the method for driving of the first comparative example.

FIG. 9A shows the initial state, FIG. 9B shows the state after the data program operation DW, and the figures illustrate a case where electrons are injected into the floating electrode 3 as the data program operation.

As shown in FIG. 9A, the initial state is a state after the execution of the normal data erase operation, and the defects in the second insulating film 5B are filled with holes. And if the data program operation DW is performed on this state, as shown in FIG. 9B, electrons are provided to the second insulating film 5B, the defects in the second insulating film 5B are filled with electrons, thereafter electrons are injected into the floating electrode 3, therefore much time is taken. That is, the data program operation DW needs much time.

On the contrary, in the method for driving the nonvolatile semiconductor memory device of this embodiment, before the data program operation DW, the defects in the region of the side near the gate electrode 4 in the second insulating film 5B are filled with electrons and the defects in the region near the floating electrode 3 in the second insulating film 5B are filled with holes, therefore the program operation is completed instantaneously and the data program operation DW can be substantially seeped up.

It is noted that the voltage and application time used for the above preliminary program operation PW1 and the preliminary erase operation PE1 depend on the dimension of the memory cell. The voltage and application time used can be varied with generations of memory cells. However, in setting the voltage and application time used for the preliminary program operation PW1 and the preliminary erase operation PE1, electrical damage to the first insulating film 5A needs to be taken into consideration. Preferably, electric field applied to the first insulating film 5A is 20 MV/cm or less. More preferably, for rapid operation at low voltage, electric field applied to the first insulating film 5A is 15 MV/cm or less, and the application time is 10 seconds or less.

Next, a description is given of the effect of electron injection on the threshold variation at the time of formation of the above charge distribution, that is, the charge distribution is such that electrons are captured near the interface of the second insulating film 5B with the gate electrode 4 and holes are captured near the interface with the floating electrode 3.

Let $V_{FB}$ be the flat band voltage of the memory cell in the above charge distribution. When a gate voltage $V_G$ is applied to the gate electrode 4, the following electric field is applied to the first insulating film 5A:

$$E = \frac{V_G - V_{FB} - \phi_S}{T} \quad (1)$$

and $V_{FB}$ is expressed as:

$$V_{FB} = -\frac{T_2 Q}{\varepsilon_2 \varepsilon_0} - \frac{1}{\varepsilon_2 \varepsilon_0} \int_0^{T_2} \rho(x) x\, dx \quad (2)$$

where $\phi_s$ is the surface potential of the semiconductor layer 1, T is the equivalent oxide thickness (EOT: Equivalent Oxide Thickness) of the overall memory stack, $T_2$ is the thickness of the second insulating film 5B and $\in_2$ is the relative dielectric constant of the second insulating film 5B. Let $T_1$ be the thickness of the first insulating film 5A, $\in_1$ be the relative dielectric constant of the first insulating film 5A and $\in_s$ be the relative dielectric constant of the insulating film (silicon oxide film). Then $T = \in_s T_1/\in_1 + \in_s T_2/\in_2$ is obtained.

And $Q(C/cm^2)$ is the amount of charge accumulated in the floating electrode 3, $\in_0$ is the dielectric constant of the vacuum and $\rho(x)$ is the charge distribution in the second insulating film 5B. Incidentally, as shown in FIG. 1, x is the distance in the direction from the gate electrode 4 to the floating electrode 3.

FIGS. 10A and 10B are graphs illustrating charge distribution in the second insulating film 5B formed by application of the method for driving the nonvolatile semiconductor memory device according to the first embodiment of the invention and the method for driving of the comparative example.

FIG. 10A and FIG. 10B show the charge distribution $\rho(x)$ in the second insulating film 5B of the nonvolatile semiconductor memory device of this embodiment and the comparative example, respectively. The horizontal axis of this figure represents the distance x in the direction from the gate electrode 4 to the floating electrode 3 and the vertical axis represents the amount of charges. Moreover, $N_H$ is the density of holes, $N_E$ is the density of electrons and q is the elementary charge.

As shown in FIG. 10A, the charge distribution $\rho(x)$ by the method for driving according to this embodiment is such that the nearly whole area of the second insulating film 5B ($T_2$) is filled with electrons and the region near the floating electrode 3 is filled with holes. That is, the charge distribution is one illustrated in FIG. 1.

Here, let J(E) be the electron current injected from the semiconductor layer 1 into the floating electrode 3 by the electric field E expressed by equation 1, and J'(E') be the electron current injected from the floating electrode 3 into the second insulating film 5B, the amount of charge Q injected into the floating electrode 3 in an infinitesimal time $\Delta t$ is expressed by $Q = (J(E) - J'(E'))\Delta t$.

In the state of charge distribution shown in FIG. 10A, if electrons for the data program operation are injected into the floating electrode 3, some of the electrons are also injected into the second insulating film 5B.

In charge distribution E1 by the method for driving according to this embodiment, as shown in 10A, the region near the floating electrode 3 in the second insulating film 5B is filled with holes. Therefore, if electrons are injected into the second insulating film 5B, electrons injected into the second insulating film 5B and holes in the region near the floating electrode 3 in the second insulating film 5B are recombined instantaneously, the region near the floating electrode 3 is filled with electrons instantaneously and the whole of the second insulating film 5B is filled with electrons. As a result, the data program operation is completed instantaneously. As a consequence, the program speed is enhanced.

That is, by preceding the injection of electrons for the data program operation by the preset P1, the defects in the second insulating film 5B can be filled with electrons before the data program operation DW. Since the defects in the second insulating film 5B are virtually filled with electrons, in the electron injection by the data program operation DW, provision of electrons into the second insulating film 5B is not necessary except making up for a shortage of electrons in the second insulating film 5B near the floating electrode 3, and thus the program operation is completed instantaneously.

On the other hand, as shown in FIG. 10B, charge distribution E2 of the second insulating film 5B by the method for driving of the first comparative example is formed by the execution of the mere erase operation before the data program operation DW, and the nearly whole area of the second insulating film 5B is filled with holes.

In the data program operation DW, electrons are also provided into the second insulating film 5B other than provision of electrons to the floating electrode 3, holes in the second insulating film 5B vanish by recombination, and filling with electrons proceeds further. Since some of charges injected into the floating electrode 3 are injected into the second insulating film 5B and the second insulating film 5B is being filled with electrons, the program operation proceeds steadily. As a result, comparing with the execution of the preset P1 like the method for driving according to this embodiment, the program speed is slow.

FIG. 11 is a graph illustrating the temporal variations of threshold voltage by the method for driving the nonvolatile semiconductor memory device according to the first embodiment of the invention and the method for driving of the first comparative example.

FIG. 11 shows the temporal variations of threshold voltage in the data program operation DW, the horizontal axis represents the time and the vertical axis represents the threshold voltage of the floating electrode 3. In this figure, the program curve W1 corresponds to this embodiment (the execution of the preset P1 before the data program operation DW) and the program curve W2 corresponds to the first comparative example (the execution of the mere erase operation before the data program operation DW). As shown in FIG. 11, in the case where the preset P1 is executed using the method for driving the nonvolatile semiconductor memory device according to this embodiment, after the defects in the second insulating film 5B are filled with electrons, the operation is moved to the program operation, therefore, the program speed is enhanced.

That is, in the method for driving the nonvolatile semiconductor memory device according to the first embodiment of the invention, preceding the data program operation DW (the electron injection to vary the threshold voltage) by the preliminary program operation PW1 and the sequential preliminary erase operation PE1 on the floating memory cell enables the program speed to be enhanced.

In particular, in the case of a P-type semiconductor layer 1, a plurality of NAND strings are connected to each other through word lines WL1-WLn. Hence the erase operation is performed on the plurality of memory cells by applying a positive erase voltage to the semiconductor layer 1 with the word lines being held at 0 V. Thus it is suitable to apply the method for driving the nonvolatile semiconductor memory device according to this embodiment collectively to a plurality of NAND strings connected through word lines before the data program operation DW (program operation intended for retention).

FIGS. 12A and 12B are graphs illustrating threshold distributions of the nonvolatile semiconductor memory device to which the method for driving the nonvolatile semiconductor memory device according to the first embodiment of the invention is applied.

FIGS. 12A, 12B illustrate a threshold distribution of a binary memory cell and a quaternary memory cell, respectively. In the figures, the horizontal axis represents the bit distribution, and the vertical axis represents the threshold voltage.

As shown in FIG. 12A, the method for driving the nonvolatile semiconductor memory device according to this embodiment is suitably applied at the time of the program operation from the "1" level to the "0" level for the binary memory cell.

As shown in FIG. 12B, there are four levels of "11", "10", "00", and "01", and the method for driving the nonvolatile semiconductor memory device according to this embodiment can be applied at the time of the data program operation DW between any pair of levels. However, under the condition that the erase operation is collectively performed, the method for driving of this embodiment can be most suitably used at the time of the program operation from the "11" level to the "10" level.

It is noted that in a NAND memory, a program-verify operation (T. Tanaka, Y. Tanaka, H. Nakamura, H. Oodaira, S. Aritome, R. Shirota, and F. Masuoka, "A Quick Intelligent Programming Architecture 3V-Only NAND-EEPROMs", Symp.VLSI Circuit Dig. Tech. Papers, pp. 20-21, June (1992)) may be used for controlling the threshold distribution resulting from variations in the memory cells.

The method for driving the nonvolatile semiconductor memory device according to this embodiment can be suitable used before and after the program-verify operation.

Second Embodiment

A method for driving the nonvolatile semiconductor memory device according to a second embodiment of the invention is a method for driving at the time of data erase.

That is, it is the case where the first polarity is the positive polarity and the second polarity is the negative polarity, namely, the case where holes are injected into the floating electrode (gate electrode) 3 in the step S230 illustrated in FIG. 5. In the method for driving the nonvolatile semiconductor memory device according to the second embodiment, the polarity described in the first embodiment is reversed. That is, the polarity of the operations illustrated in FIG. 5 and FIG. 6 may be reversed.

Figure 13:
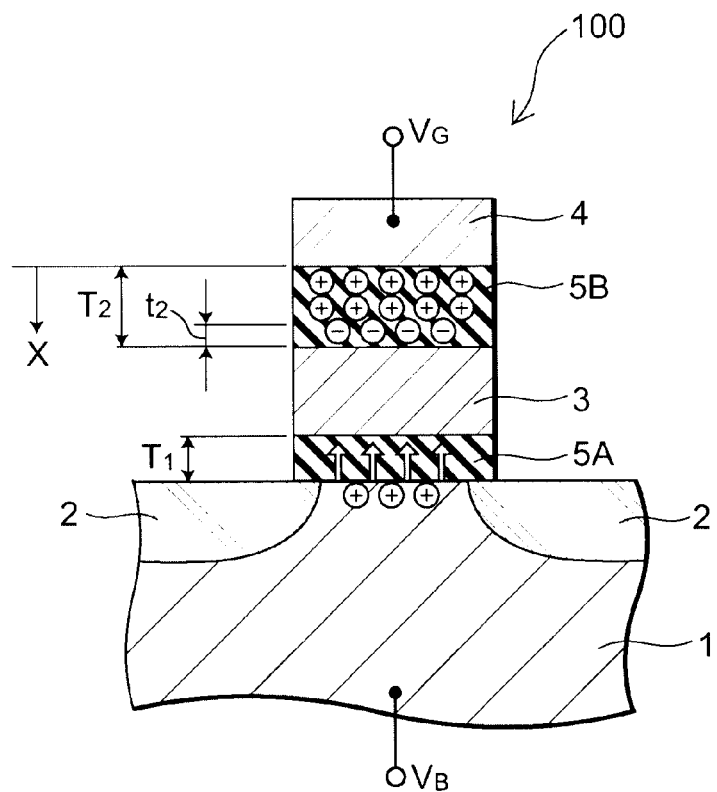
FIG. 13 is a schematic cross-sectional view illustrating charge distribution formed by application of a method according to a second embodiment of the invention.

FIG. 13 is a schematic cross-sectional view illustrating charge distribution formed by application of the method for driving a nonvolatile semiconductor memory device according to the second embodiment of the invention.

FIG. 13 illustrates the charge distribution before the data erase operation DE.

As shown in FIG. 13, the method for driving the nonvolatile semiconductor memory device according to the second embodiment of the invention forms the charge distribution where the nearly whole region of the second insulating film 5B is filled with holes and the region near the interface with the floating electrode 3 is filled with electrons before the data erase operation.

This enables efficiency of the data erase operation to be improved and to be substantially speeded up.

Figure 14:
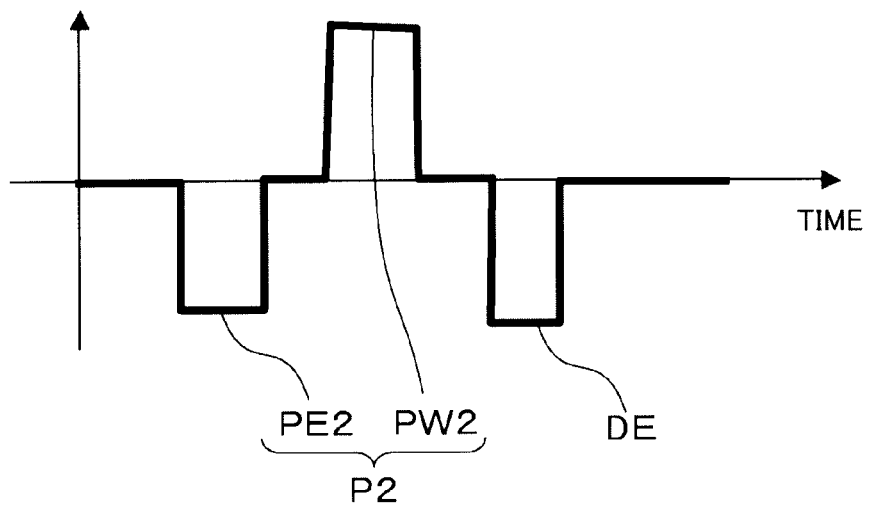
FIG. 14 is a graph illustrating the method according to the second embodiment.

FIG. 14 is a graph illustrating the method for driving the nonvolatile semiconductor memory device according to the second embodiment of the invention.

FIG. 14 illustrates a case of injecting holes into the floating electrode 3 as the data erase operation DE. The horizontal axis of the figure represents the time and the vertical axis represents the potential difference between the semiconductor layer 1 and the gate electrode 4. As shown in FIG. 14, at the time of hole injection into the floating electrode 3 for the data erase operation DE, in the method for driving the nonvolatile semiconductor memory device according to this embodiment, after the providing the first potential difference for the preliminary data erase operation PE2 on the nonvolatile semiconductor memory device, the second potential difference for the preliminary program operation PW2 is provided, after that the third potential difference for the data erase operation DE is provided. Here, the first potential difference and the third potential difference are assumed to have the same polarity. And the second potential difference has the positive polarity. That is, the polarity of charges injected and the polarity of the potential difference provided therefor are opposite each other.

That is, the first polarity is the positive polarity, the first potential difference (preliminary erase operation PE2) is provided by application of a voltage lower than a voltage applied to the semiconductor layer 1 to the gate electrode 4, the second potential difference (preliminary program operation PW2) is provided by application of a voltage higher than a voltage applied to the semiconductor layer 1 to the gate electrode 4, and the third potential difference (data erase operation DE) is provided by application of a voltage lower than a voltage applied to the semiconductor layer 1 to the gate electrode 4.

That is, in the second embodiment injecting holes into the floating electrode 3, the polarity is reversed with respect to the first embodiment injecting electrons described above.

It is noted that the sequence of operations including the above preliminary erase operation PE2 and the preliminary program operation PW2 is hereinafter referred to as preset P2.

As described above, preceding the data erase operation DE (hole injection to vary the threshold voltage) by the preset P2 (the preliminary erase operation PE2 and the preliminary program operation PW2) allows formation of the charge distribution being such that the nearly whole region of the second insulating film 5B is filled with holes and the region near the interface with the floating electrode 3 is filled with electrons before the data erase operation as shown in FIG. 13.

Herewith, as with the effect described in the first embodiment, the method for driving the nonvolatile semiconductor memory device according to this embodiment enables efficiency of the data erase operation to be improved and to be substantially speeded up.

It is noted that in the case of using a NAND memory cell, collective use of this embodiment causes the erase operation to be redundant. Therefore, the preliminary erase operation PE2 can be substantially omitted. On the other hand, contrary to the nonvolatile semiconductor memory device 100 described above, the method for driving the nonvolatile semiconductor memory device according to this embodiment can be suitably applied to another memory cell having an opposite polarity. That is, by reversing the polarity of impurities in the source/drain region 2 and the semiconductor layer 1 and exchanging the voltages applied to the semiconductor layer 1 and the gate electrode 4, the method for driving of this embodiment can be suitably applied to another memory cell having the opposite polarity.

It is noted that the voltage pulse used for the preset P1 or the preset P2 may be a combination of a plurality of voltage pulses. That is, the preliminary program operations PW1, PW2 and the preliminary erase operations PE1, PE2 may be performed more than once, respectively. At this time, at least the combination satisfies: all the applied voltages have the same polarity, and the threshold after application of the pulses reaches an intended threshold.

Next, a method for operating a NAND string to which the method for driving the nonvolatile semiconductor memory device according to this embodiment described above is described.

In a NAND memory, a NAND string is connected through word lines WL1-WLn to the adjacent NAND string. Hence it is suitable to apply collectively the nonvolatile semiconductor memory device of this embodiment to a plurality of NAND strings.

Figure 15:
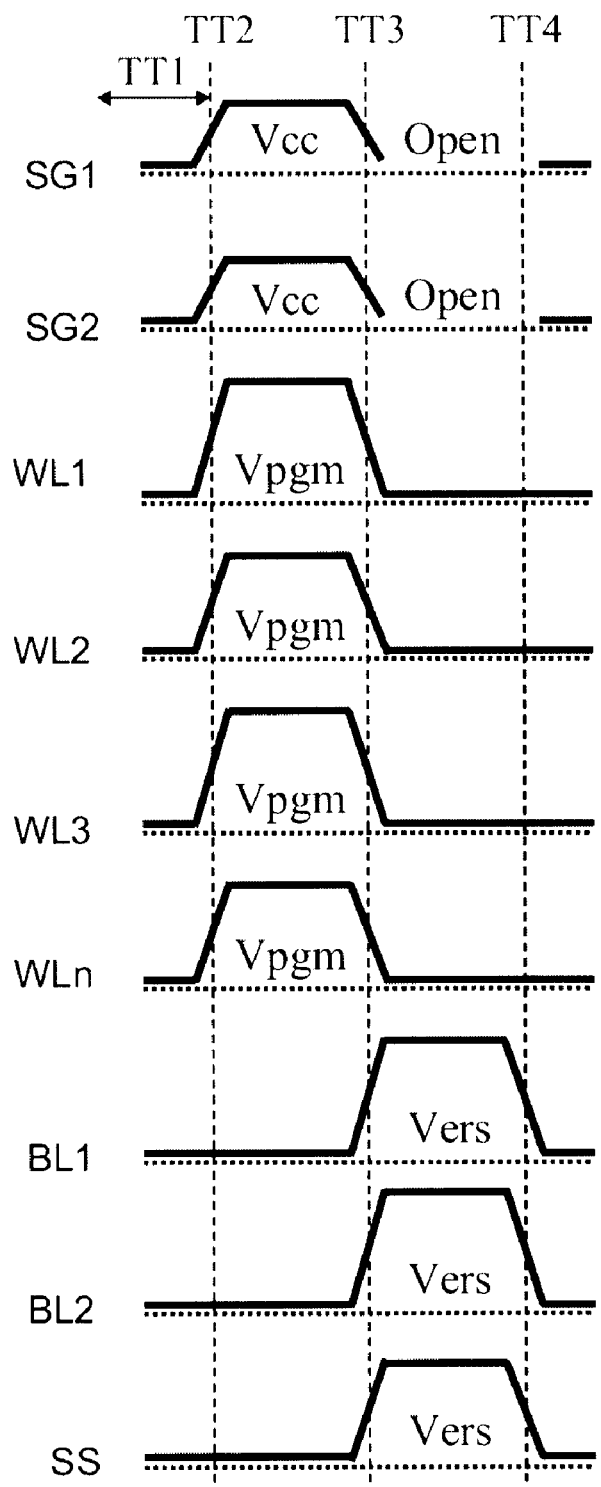
FIG. 15 is a time chart illustrating the method according to this embodiment.

FIG. 15 is a time chart illustrating the method for driving the nonvolatile semiconductor memory device according to this embodiment of the invention.

In the figure, SG1 and SG2 correspond to select gates, WL1, WL2, WL3 and WLn correspond to word lines, BL1 and BL2 correspond to bit lines and SS corresponds to the semiconductor layer 1.

In the method for driving the nonvolatile semiconductor memory device according to this embodiment, the preset P1 is performed in accordance with the time chart illustrated in FIG. 15.

That is, a program-verify operation is completed during time TT1 before time TT2. Then the preliminary program operation PW1 is performed during the time from time TT2 to time TT3. In the preliminary program operation PW1, with the potential of the bit line BL2 held at 0 V, a voltage of approximately 5 V is applied to the select gate SG2 to turn the second select transistor S2 into the conducting state. Furthermore, a voltage VPGM used for the program operation is applied to the word lines WL1-WLn.

Next, the preliminary erase operation PE1 is performed during the time from time TT2 to time TT3. In the preliminary erase operation PE1, with the potential of the word lines WL1-WLn held at 0 V, a voltage VERS is applied to the semiconductor layer 1. The data program operation DW (electron injection for varying the threshold) is performed after time TT4.

Similarly, at the time of the data erase operation DE, the preliminary erase operation PE2 is performed during the time from time TT2 to TT3, the preliminary program operation PW2 is performed during the time from time TT3 to TT4, and the data erase operation DE (hole injection for varying the threshold) is performed after time TT4.

Besides NAND memory cells, the method for driving the nonvolatile semiconductor memory device according to this embodiment is applicable to any cells having an insulating film including defects with a charge trapping characteristics. For example, also in a NOR memory cell, the preset P1 or the preset P2 can be used to control the charge distribution in the insulating film, and the variation of threshold voltage by charge injection, namely, the data program operation DW and the data erase operation DE is speeded up.

Third Embodiment

Next, a third embodiment of the invention will be described.

In a method for driving a nonvolatile semiconductor memory device according to the third embodiment, retention characteristics after electron injection is enhanced. In this embodiment, the charge injection for varying the threshold is followed by a post charge injection. That is, in this embodiment, after the charges are injected for varying the threshold, the program operation or the erase operation is performed in accordance with the polarity of injected charge, and thereby the retention characteristics is enhanced.

Figure 16:
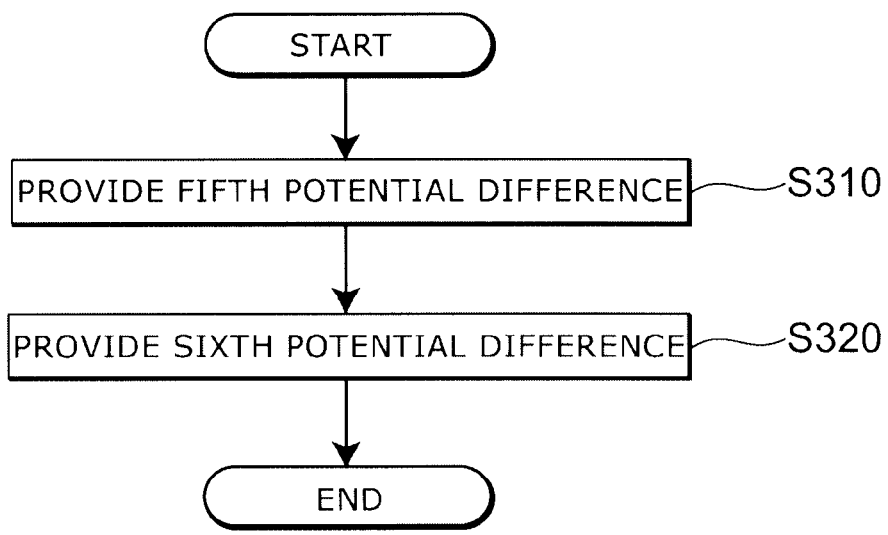
FIG. 16 is a flow chart illustrating a method according to a third embodiment of the invention.

FIG. 16 is a flow chart illustrating a method for driving a nonvolatile semiconductor memory device according to a third embodiment of the invention.

As shown in FIG. 16, in the method for driving the nonvolatile semiconductor memory device according to the third embodiment, first, a fifth potential difference is provided between the semiconductor layer 1 and the gate electrode 4 (step S310). This fifth potential difference injects charges having the first polarity into the floating electrode 3.

And a sixth potential difference is provided between the semiconductor layer 1 and the gate electrode 4 (step S320). This sixth potential difference injects charges having the second polarity opposite to the first polarity into the second insulating film 5B.

Herewith, the data retention characteristics can be enhanced by electrically controlling the charge distribution in the insulating film.

Figure 17:
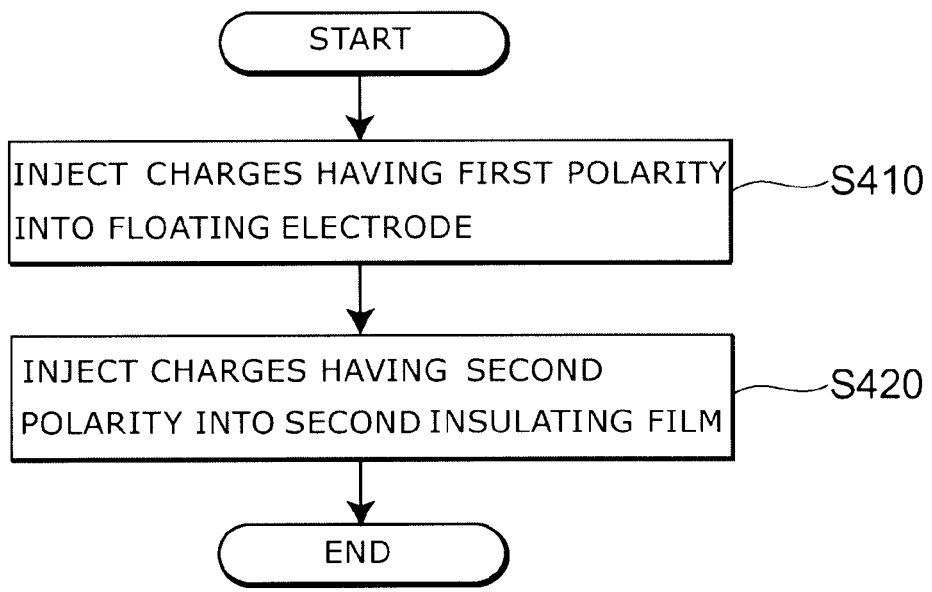
FIG. 17 is another flow chart illustrating the method according to the third embodiment.

FIG. 17 is another flow chart illustrating the method for driving the nonvolatile semiconductor memory device according to the third embodiment of the invention.

That is, as shown in FIG. 17, in the method for driving the nonvolatile semiconductor memory device according to the third embodiment of the invention, first, charges having the first polarity are injected into the floating electrode 3 (step S410).

And charges having the second polarity opposite to the first polarity are injected into the second insulating film 5B (step S420).

This can suppresses the variation of threshold voltage of the floating electrode 3. That is, the data retention characteristics can be enhanced by electrically controlling the charge distribution in the insulating film.

Figure 18:
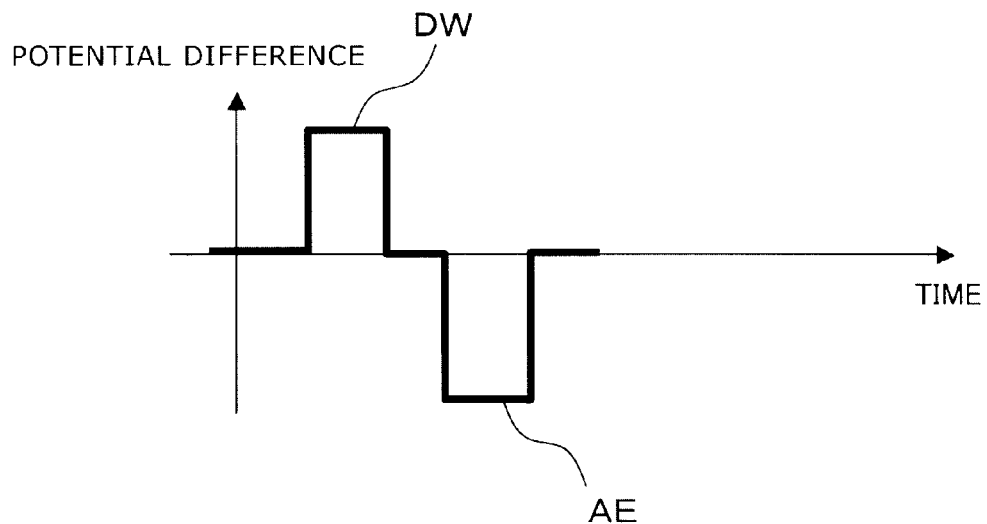
FIG. 18 is a graph illustrating the method according to the third embodiment.

FIG. 18 is a graph illustrating the method for driving the nonvolatile semiconductor memory device according to the third embodiment of the invention.

FIG. 18 illustrates a case of injecting electrons into the floating electrode 3 as the data program operation. The horizontal axis of the figure represents the time, and the vertical axis represents the potential difference between the semiconductor layer 1 and the gate electrode 4.

As shown in FIG. 18, in the method for driving the nonvolatile semiconductor memory device according to this embodiment, after the fifth potential difference for the data program operation DW is provided to the nonvolatile semiconductor memory device, the sixth potential difference for an after erase operation AE is provided. Here, the fifth potential difference has the positive polarity and the sixth potential difference has the negative polarity.

That is, the first polarity is the negative polarity, the fifth potential difference (data program operation DW) is provided by application of a voltage higher than a voltage applied to the semiconductor layer 1 to the gate electrode 4, and the sixth potential difference (after erase operation AE) is provided by application of a voltage lower than a voltage applied to the semiconductor layer 1 to the gate electrode 4.

Figures 19A, 19B:
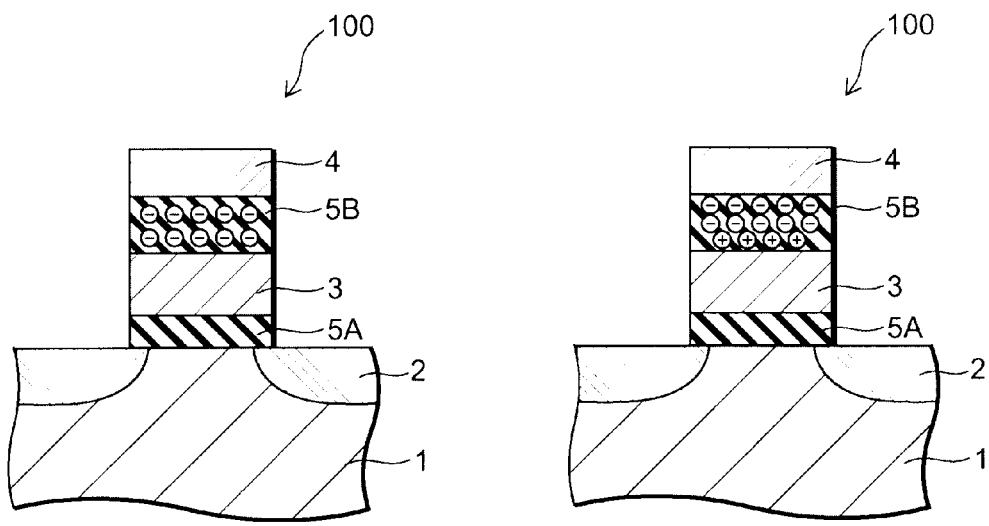
FIGS. 19A and 19B are schematic cross-sectional views illustrating the temporal variation of charge distribution formed by application of the method according to the third embodiment.

FIGS. 19A and 19B are schematic cross-sectional views illustrating the temporal variation of charge distribution formed by application of the method for driving the nonvolatile semiconductor memory device according to the third embodiment of the invention.

FIG. 19A shows the state after the data program operation DW, and FIG. 19B shows the state after the after erase operation AE. And the figures illustrate a case of injecting electrons into the floating electrode 3 as the data program operation DW.

As shown in FIG. 19A, in the method for driving the nonvolatile semiconductor memory device according to this embodiment, electrons are injected into the floating electrode 3 by performing the data program operation DW. Herewith, electrons are also injected into the second insulating film 5B and are captured by defects in the second insulating film 5B.

And as shown in FIG. 19B, holes are injected into the second insulating film 5B by the after erase operation AE, and are captured in the region near the floating electrode 3.

Figure 20:
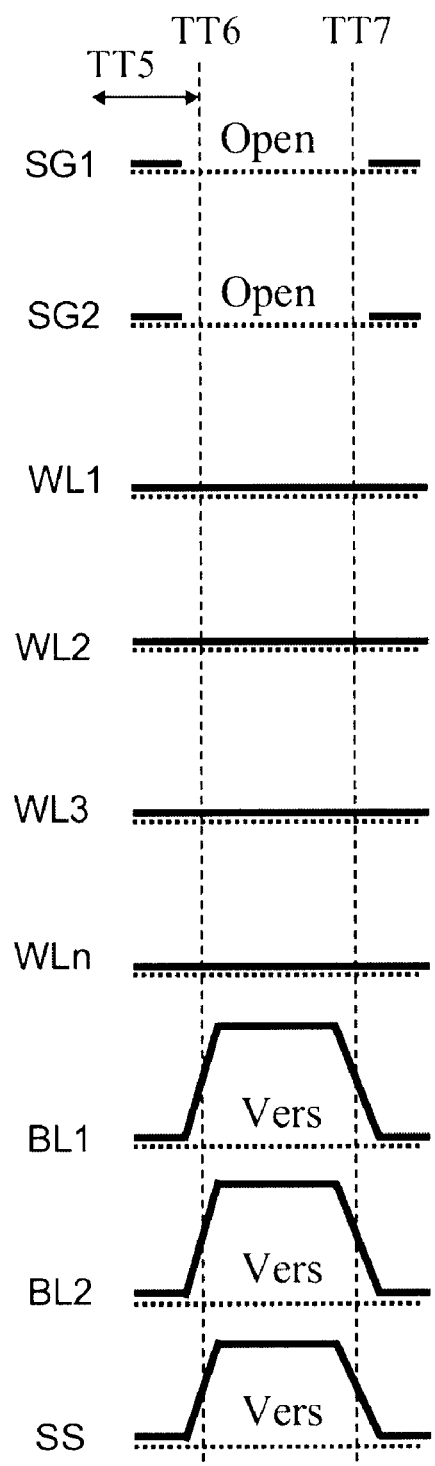
FIG. 20 is a time chart illustrating the method according to the third embodiment.

FIG. 20 is a time chart illustrating the method for driving the nonvolatile semiconductor memory device according to the third embodiment of the invention.

FIG. 20 shows a time chart at the after erase operation AE on the NAND string illustrated in FIG. 4. In the figure, SG1 and SG2 correspond to select gates, WL1, WL2, WL3 and WL4 correspond to word lines, BL1 and BL2 correspond to bit lines and SS corresponds to the semiconductor layer 1.

First, as shown in FIG. 20, electron injection is completed within time TT5 before time TT6. For example, a threshold achieved by the electron injection is taken as $V_{TH,1}$.

Thereafter, the after erase operation AE is performed during the time from time TT6 to time TT7. Specifically, a voltage for the after erase operation AE is applied to the semiconductor layer 1, with the potential of the word lines WL1-WLn being held at 0 V. The amount of variation of the threshold resulting from the after erase operation AE is taken as $\Delta V_{TH,1}$. As a result, a threshold $V_{TH,2}$ of the memory cell becomes:

$$V_{TH,2} = V_{TH,1} - \Delta V_{TH,1} \qquad (3)$$

After time TT7, charge retention continues until the next charge injection is performed.

In setting the voltage used for the after erase operation AE, electrical damage to the first insulating film 5A needs to be taken into consideration. Preferably, electric field applied to the first insulating film 5A is 20 MV/cm or less. More preferably, for rapid operation at low voltage, electric field applied to the first insulating film 5A is 15 MV/cm or less, and the application time is 10 seconds or less.

Figure 21:
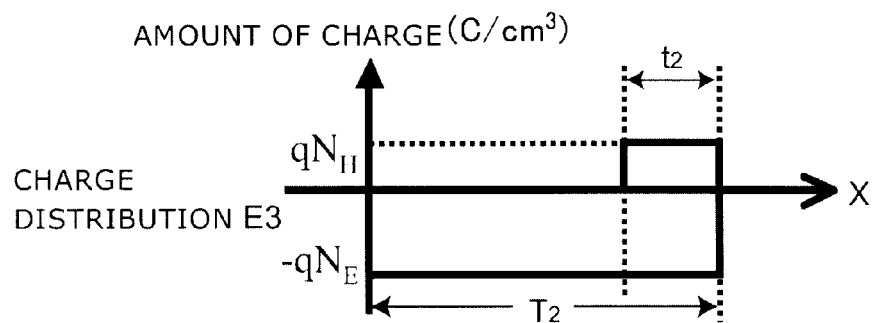
FIG. 21 is a schematic cross-sectional view illustrating charge distribution formed by application of the method according to the third embodiment.

FIG. 21 is a schematic cross-sectional view illustrating charge distribution formed by application of the method for driving the nonvolatile semiconductor memory device according to the third embodiment of the invention.

FIG. 21 shows the charge distribution ρ(x) in the second insulating film 5B of the nonvolatile semiconductor memory device after the after erase operation AE following the data program operation DE. The horizontal axis of this figure represents the distance x in the direction from the gate electrode 4 to the floating electrode 3 and the vertical axis represents the amount of charges.

As shown in FIG. 21, the charge distribution ρ(x) (charge distribution E3) by the method for driving according to this embodiment is such that the nearly whole area of the second insulating film 5B (T$_2$) is filled with electrons and the region near the floating electrode 3 is filled with holes. That is, the charge distribution is one illustrated in FIG. 19B.

That is, in the charge distribution in the second insulating film 5B just after completion of the after erase operation AE, electrons exist in the whole area of the second insulating film 5B at a density of N$_E$(cm$^{-3}$), and holes exist in the region with a thickness of t$_2$ near the interface with the floating electrode 3 at a density of N$_H$(cm$^{-3}$). At this time, the threshold voltage of the floating electrode 3 becomes:

$$V_{t1} = -\frac{T_2 Q}{\varepsilon_2 \varepsilon_0} - \frac{1}{\varepsilon_2 \varepsilon_0}\int_0^{T_2} \rho(x)x\,dx \qquad (4)$$

$$= -\frac{T_2 Q}{\varepsilon_2 \varepsilon_0} + \frac{qN_E}{\varepsilon_2 \varepsilon_0}T_2^2 - \frac{qN_H}{\varepsilon_2 \varepsilon_0}T_2^2 + \frac{qN_H}{\varepsilon_2 \varepsilon_0}(T_2 - t_2)^2$$

At this time, in the process of charge retention, if holes near the interface with the floating electrode 3 in the second insulating film 5B diffuse uniformly into the second insulating film 5B, the threshold voltage becomes:

$$V_{t2} = -\frac{T_2 Q}{\varepsilon_2 \varepsilon_0} - \frac{1}{\varepsilon_2 \varepsilon_0}\int_0^{T_2} \rho(x)x\,dx \qquad (5)$$

$$= -\frac{T_2 Q}{\varepsilon_2 \varepsilon_0} + \frac{qN_E}{\varepsilon_2 \varepsilon_0}T_2^2 - \frac{qN_H}{\varepsilon_2 \varepsilon_0}t_2 T_2$$

From equation (4) and equation (5), the threshold variation becomes:

$$V_{t2} - V_{t1} = \frac{qN_H}{\varepsilon_2 \varepsilon_0}t_2(T_2 - t_2) \qquad (6)$$

In the case where holes in the second insulating film 5B are distributed only in the region near the interface with the floating electrode 3 (T$_2$>t$_2$), the threshold voltage increases. That is, if holes existing in the region near the interface with the floating electrode 3 in the second insulating film 5B are re-distributed (hole redistribution) throughout the whole area of the second insulating film 5B in the retention process, the effect of increasing the threshold voltage is produced.

On the other hand, in the process of charge retention in the floating electrode 3, charges in the second insulating film 5B are released to the gate electrode 4. Charges stored in the floating electrode 3 are also released through the first insulating film 5A or the second insulating film 5B to the floating electrode 3 and the gate electrode 4. Release of charges results in decreasing the threshold. In particular, release of electrons is the main cause of the threshold decrease.

Figure 22:
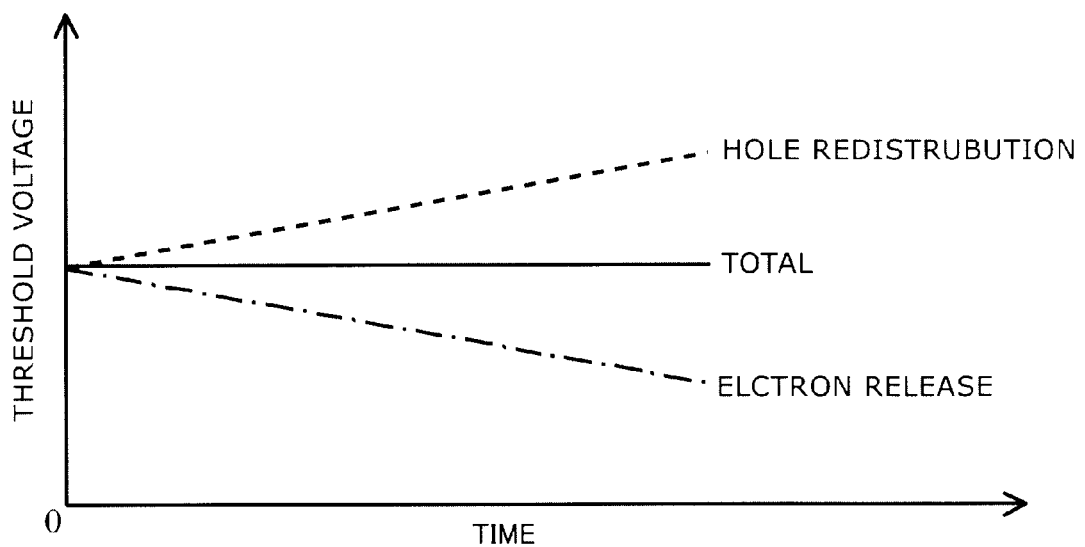
FIG. 22 is a graph illustrating the change of threshold voltage by the method according to the third embodiment.

FIG. 22 is a graph illustrating the change of threshold voltage by the method for driving the nonvolatile semiconductor memory device according to the third embodiment of the invention.

The horizontal axis of the figure represents the time and the vertical axis represents the threshold voltage. The broken line represents the variation of the threshold voltage resulting from the above hole redistribution, the dashed line represents the variation of the threshold voltage resulting from the above electron release, and the solid line represents the variation of the total threshold voltage resulting from both the hole redistribution and the electron release.

As shown in FIG. 22, holes are distributed only in the region near the interface with the floating electrode 3 in the second insulating film 5B and the holes are redistributed, and thereby the threshold voltage increases with time. On the other hand, release of electrons stored in the floating electrode 3 results in the threshold voltage decrease with time. Since the threshold voltage increase resulting from the hole redistribution and the threshold voltage decrease resulting from the electron release are opposite in their behaviors, they compensate each other. That is, in the method for driving the nonvolatile semiconductor memory device according to this embodiment, performing the after erase operation AE following the data program operation DW (electron injection) can accelerate the redistribution of charges in the second insulating film 5B during the charge retention process, and this charge redistribution compensates the threshold voltage decrease resulting from the charge release, and consequently has the effect of suppressing the variation of the threshold voltage.

Second Comparative Example

A method for driving the nonvolatile semiconductor memory device of a second comparative example does not include the step S320 illustrated in FIG. 16. That is, the step S420 illustrated in FIG. 17 is not included. Furthermore, after the data program operation DW, the after erase operation AE illustrated in FIG. 18 is not included. Therefore, the charge distribution after the data program operation DW is such that illustrated in FIG. 19A. That is, a sufficient amount of electrons are injected during time TT5 before time TT6 as the data program operation DW and defects in the second insulating film 5B are filled with electrons. And like the case of this embodiment, holes do not exist in the region near the interface with the floating electrode 3 in the second insulating film 5B. Therefore, no means for compensating the threshold voltage decrease results in the threshold voltage decrease during the retention time.

Figure 23:
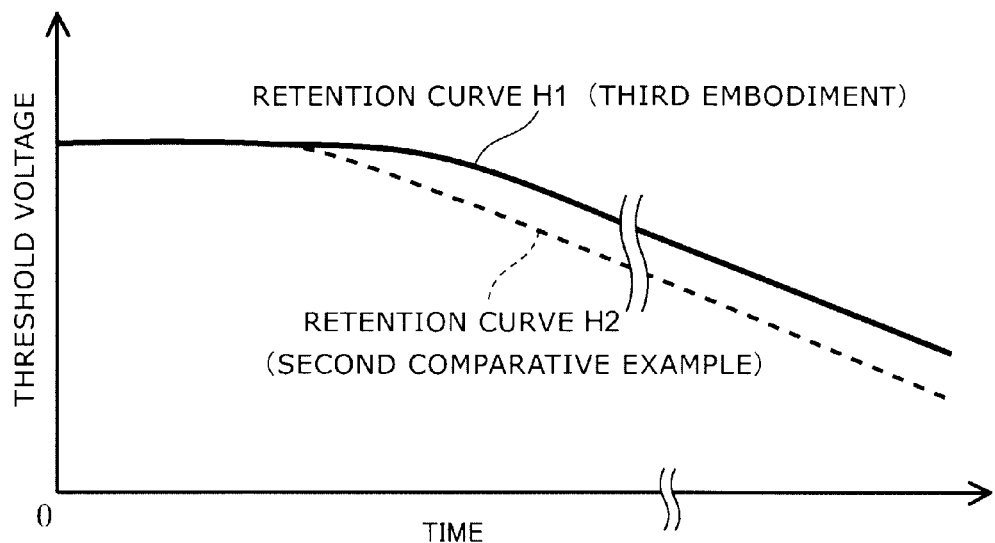
FIG. 23 is a graph illustrating of the temporal variations of threshold voltage by the method according to the third embodiment and the method of the second comparative example.

FIG. 23 is a graph illustrating of the temporal variations of threshold voltage by the method for driving the nonvolatile semiconductor memory device according to the third embodiment of the invention and the method for driving of the second comparative example.

FIG. 23 illustrates the temporal variation of the threshold voltage in the state of charge retention, the horizontal axis represents the time and the vertical axis represents the threshold voltage. In the figure, the retention curve H1 corresponds to the method for driving the nonvolatile semiconductor memory device according to this embodiment and the retention curve H2 corresponds to the method for driving of the second comparative example.

As shown in FIG. 23, in the method for driving the nonvolatile semiconductor memory device according to this embodiment, the after erase operation AE performed after the data program operation DW (electron injection) results in the retention characteristics of the threshold voltage as represented by the retention curve H1. On the other hand, in the method for driving of the second comparative example, the after erase operation AE omitted after the data program operation (electron injection) results in the characteristics as represented by the retention curve H2. That is, the method for driving according to this embodiment can delay the variation of the threshold voltage.

As described above, in the method for driving the nonvolatile semiconductor memory device according to this embodiment, the after erase operation AE performed after the data program operation DW (electron injection) enhances the retention characteristics of the threshold voltage.

It is noted that the voltage pulse used for after erase operation AE may be a combination of a plurality of voltage pulses. At this time, at least the combination satisfies: all the applied voltages have the same polarity, and the threshold after application of the pulses reaches an intended threshold.

Fourth Embodiment

Next, a fourth embodiment of the invention will be described.

The method for driving the nonvolatile semiconductor memory device according to the third embodiment described above has enhanced the retention characteristics after injecting charges for the data program operation DW into the floating electrode 3. At this time, the case where electrons are injected as charges has been described, however, the invention is not limited to this and can be applied to the case of injecting holes.

A method for driving the nonvolatile semiconductor memory device according to the fourth embodiment enhances the retention characteristics in the case of injecting holes, namely, in the case of data erase operation. In this case, it is desirable to reverse the polarity described in the third embodiment.

That is, the first polarity is the positive polarity, a fifth potential difference is provided by application of an voltage lower than a voltage applied to the semiconductor layer 1 to the gate electrode 4, and a sixth potential difference is provided by application of a voltage higher than a voltage applied to the semiconductor layer 1 to the gate electrode 4.

Figure 24:
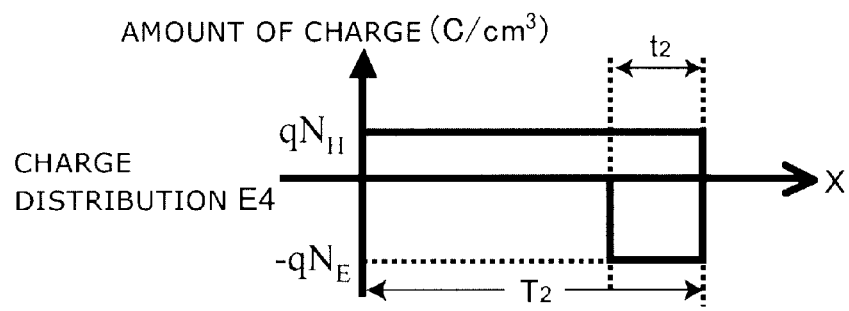
FIG. 24 is a schematic cross-sectional view illustrating charge distribution formed by application of a method according to a fourth embodiment of the invention.

FIG. 24 is a schematic cross-sectional view illustrating charge distribution formed by application of the method for driving the nonvolatile semiconductor memory device according to the fourth embodiment of the invention.

FIG. 24 shows the charge distribution ρ(x) in the second insulating film 5B of the nonvolatile semiconductor memory device after an after program operation AW following the data erase operation DE (hole injection into the floating electrode 3) in the case of applying the method for driving of this embodiment. The horizontal axis of this figure represents the distance x in the direction from the gate electrode 4 to the floating electrode 3 and the vertical axis represents the amount of charges.

As shown in FIG. 24, the charge distribution ρ(x) (charge distribution E4) formed by the method for driving according to this embodiment is such that the nearly whole area of the second insulating film 5B ($T_2$) is filled with holes and the region near the floating electrode 3 is filled with electrons.

This enhances the retention characteristics after the data erase operation by the same effect as that described in the third embodiment.

That is, when electrons existing in the region near the interface with the floating electrode 3 in the second insulating film 5B are redistributed (electron redistribution) throughout the whole area of the second insulating film 5B during the retention process, the threshold voltage decreases. On the other hand, holes in the second insulating film 5B are released from the floating electrode 3 to the gate electrode 4 and the semiconductor layer 1 during the charge retention process in the floating electrode 3, and the threshold voltage increases. Since the variations of the threshold voltages are opposite in their behaviors each other, both compensate each other, and consequently the retention characteristics after the data erase operation is enhanced.

Figure 25:
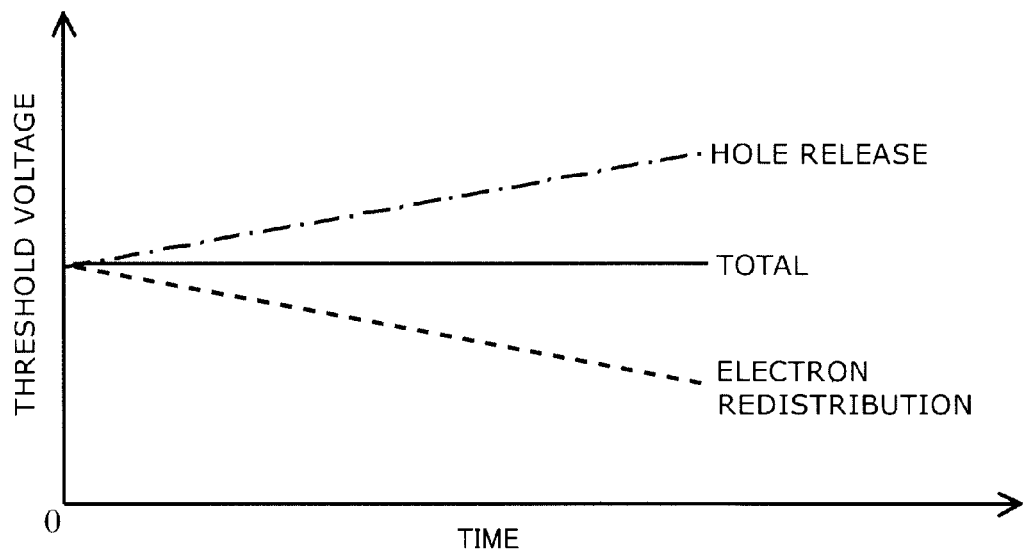
FIG. 25 is a graph illustrating the change of threshold voltage by the method according to the fourth embodiment.

FIG. 25 is a graph illustrating the change of threshold voltage by the method for driving the nonvolatile semiconductor memory device according to the fourth embodiment of the invention.

The horizontal axis of the figure represents the time and the vertical axis represents the threshold voltage. The broken line represents the variation of the threshold voltage resulting from the above electron redistribution, the dashed line represents the variation of the threshold voltage resulting from the above hole release, and the solid line represents the variation of the total threshold voltage resulting from both the electron redistribution and the hole release.

As shown in FIG. 25, electrons are distributed in the region near the interface with the floating electrode 3 in the second insulating film 5B and the electrons are redistributed, and thereby the threshold voltage decreases with time. On the other hand, release of holes stored in the floating electrode 3 results in the threshold voltage increase with time. Since the threshold voltage increase resulting from the electron redistribution and the threshold voltage decrease resulting from the hole release are opposite in their behaviors, they compensate each other.

That is, in the method for driving the nonvolatile semiconductor memory device according to this embodiment, performing the after program operation AW following the data erase operation DE (hole injection) can accelerate the redistribution of charges in the second insulating film 5B during the charge retention process, and this charge redistribution compensates the threshold voltage decrease resulting from the charge release, and consequently has the effect of suppressing the variation of the threshold voltage.

It is noted that the methods for driving the nonvolatile semiconductor memory device according to the first through fourth embodiments described above may be sequentially performed.

That is, the first potential difference is provided between the semiconductor layer 1 and the gate electrode 4 to inject charges having the first polarity into the second insulating film 5B, after that the second potential difference is provided between the semiconductor layer 1 and the gate electrode 4 to inject charges having the second polarity opposite to the first polarity into the second insulating film 5B, after that the third potential difference is provided between the semiconductor layer 1 and the gate electrode 4 to inject charges having the first polarity into the floating electrode 3, after that the fourth potential difference is provided between the semiconductor layer 1 and the gate electrode 4 to inject charges having the second polarity into the second insulating film 5B.

This speeds up the data program operation and the data erase operation, and enhances the retention characteristics after the data program operation and the data erase operation.

Fifth Embodiment

Next, a fifth embodiment of the invention will be described.

Figure 26:
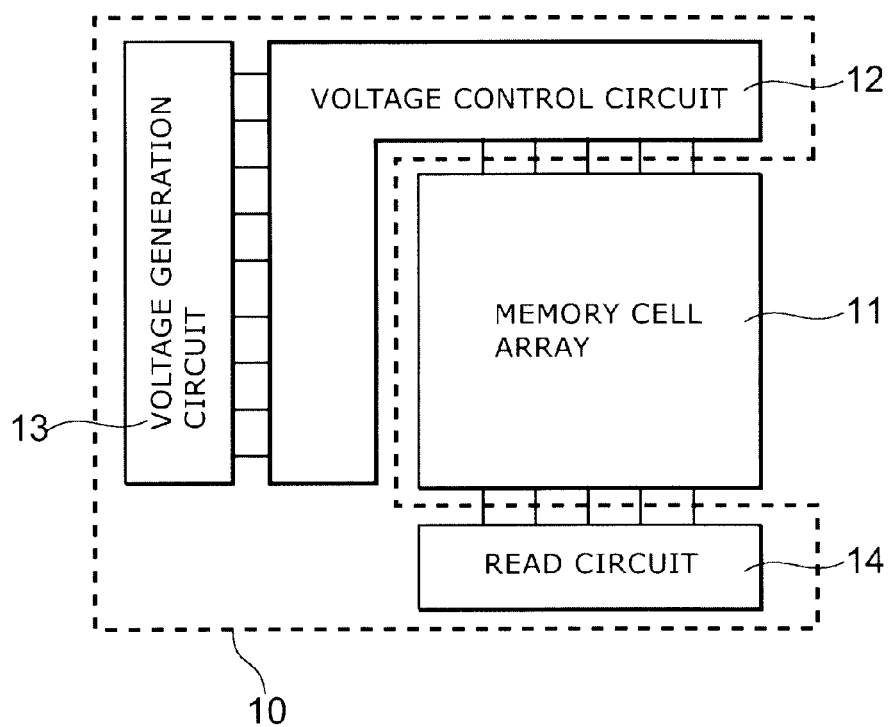
FIG. 26 is a block diagram illustrating the configuration of a nonvolatile semiconductor memory device according to a fifth embodiment of the invention.

FIG. 26 is a block diagram illustrating the configuration of a nonvolatile semiconductor memory device according to the fifth embodiment of the invention.

As shown in FIG. 26, the nonvolatile semiconductor memory device according to the fifth embodiment of the invention includes a memory cell array 11 and a control circuit 10. Each memory cell in the memory cell array 11 is a transistor type memory cell having the floating electrode 3.

More specifically, the memory cell 11 includes the source/drain regions 2 spaced from each other in the surface portion of the semiconductor layer 1, the first insulating film 5A provided on the channel between the source/drain regions 2, the floating electrode 3 provided on the first insulating film 5A, the second insulating film 5B provided on the floating electrode 3 and the gate electrode 4 provided on the second insulating film 5B.

The control circuit 10 performs at least any of the methods for driving according to respective embodiments described above.

The control circuit 10 includes a voltage generation circuit 13 for generating a program voltage, an erase voltage, or a read voltage, a voltage control circuit 12 for coupling the voltage generated in the voltage generation circuit 13 to the memory cell array 11, and a read circuit 14 for reading information programmed in the memory cell array 11.

The voltage required for implementing each operation of the preset P1, the preset P2, the after erase operation AE, the after program operation AW, the data program operation DW and the data erase operation DE described in the first to fourth embodiments is supplied from the voltage generation circuit 13. The application time required for each operation is controlled by the voltage control circuit 12.

It is noted that the method for driving the nonvolatile semiconductor memory device and the nonvolatile semiconductor memory device according to the embodiments described above are applicable to all of the floating gate memory cells. For example, the material of the semiconductor layer 1 is not limited to a silicon substrate, but may be a polysilicon substrate, a SiGe substrate, a Ge substrate, or a SiGeC substrate. The configuration of the semiconductor layer 1 is not limited to a P-type well or a P-type semiconductor layer (SOI), but may be SGOI (silicon germanium on insulator) or GOI (germanium on insulator).

The floating gate flash memory having the high dielectric material applied to the insulating film has charge trapping characteristics being taken on by the high dielectric material. Therefore, the method for driving the nonvolatile semiconductor memory device and the nonvolatile semiconductor memory device according to the embodiments described above are suitably applicable to the floating gate flash memory having the high dielectric material applied to the insulating film.

The floating gate memory cell may be configured as a vertical transistor or a FIN transistor. Alternatively, the memory cell array itself may have a vertically laminated structure.

The invention is applicable to various memory cell arrays having the memory cell including the floating gate electrode. Such memory cell arrays include not only of the NAND type and the NOR type, but also of the AND type (H. Kume, M. Kato, T. Adachi, T. Tanaka, T. Sasaki, T. Okazaki, N. Miyamoto, S. Saeki, Y. Ohji, M. Ushiyama, J. Yagami, T. Morimoto, and T. Nishida, "A 1.28 $\mu m^2$ contactless memory cell technology for a 3V-only 64 Mbit EEPROM", IEDM Tech. Dig., pp. 991-993, December (1992)), the DINOR type (H. Onoda, Y. Kunori, S. Kobayashi, M. Ohi, A. Fukumoto, N. Ajika, and H. Miyoshi, "A novel cell structure suitable for a 3 volt operation, sector erase flash memory", IEDM Tech. Dig., pp. 599-602, December (1992)), the split gate type (G. Samachisa, C. Su, Y. Kao, G. Smarandoiu, T. Wong, and C. Hu, "A 128K flash EEPROM using double polysilicon technology", ISSCC Dig. Tech. Papers, pp. 76-77, February (1987)), the stack type (V. N. Kynett, A. Baker, M. Fandrich, G. Hoekstra, O. Jungroth, J. Kreifels, and S. Wells, "An in-system reprogrammable 256K CMOS flash memory", ISSCC Dig. Tech. Papers, pp. 132-133, February (1988)), the triple layer polysilicon type (F. Masuoka, M. Asano, H. Iwashita, T. Komuro, and S. Tanaka, "A new flash EEPROM cell using triple polysilicon technology", IEDM Tech. Dig., pp. 464-467, December (1984)), and the 3Tr-NAND (JP-A 2007-115407(Kokai)).

Furthermore, the method for driving the nonvolatile semiconductor memory device and the nonvolatile semiconductor memory device according to the embodiments described above are described with the charge injection from the semiconductor layer 1 in mind, however, are also applicable to a gate injection memory cell having charges injected from the gate electrode 4.

In the gate injection memory cell, the semiconductor layer 1 and the gate electrode 4 have opposite roles in the charge injection into the floating electrode 3. Therefore, by exchange the voltage applied to the semiconductor layer 1 with the voltage applied to the gate electrode 4, the method for driving the nonvolatile semiconductor memory device and the nonvolatile semiconductor memory device according to the first to fifth embodiments are applicable to the gate injection memory cell.

The embodiment of the invention has been described with reference to the examples. However, the invention is not limited to these examples. For example, the specific configuration of respective elements comprising the method for driving the nonvolatile semiconductor memory device and the nonvolatile semiconductor memory device are encompassed within the scope of the invention as long as a person skilled in the art could have worked the invention similarly by selecting properly from the publicly known scope and achieve the same effect.

Combinations of any two or more elements among respective specific examples within the technically possible range are also encompassed within the scope of the invention as long as they include the features of the invention.

In addition, all of the method for driving the nonvolatile semiconductor memory device and the nonvolatile semiconductor memory device which a person skilled in the art could have worked by the proper design variation on the basis of the method for driving the nonvolatile semiconductor memory device and the nonvolatile semiconductor memory device described above as the embodiment of the invention are also encompassed within the scope of the invention as long as they include the features of the invention.

It is perceived that a person skilled in the art could have made various corrections and modifications in the category of the invention and these corrections and modifications are also encompassed within the scope of the invention.

The invention claimed is:

1. A method for driving a nonvolatile semiconductor memory device having a semiconductor layer having a channel and source/drain regions provided on both sides of the channel, a first insulating film provided on the channel, a floating electrode provided on the first insulating film, a second insulating film provided on the floating electrode, and a gate electrode provided on the second insulating film, the nonvolatile semiconductor memory device changing its data memory state by injection of charges into the floating electrode, the method comprising, to achieve a state in which charges having a first polarity are injected into the floating electrode:
providing a first potential difference between the semiconductor layer and the gate electrode to inject charges having the first polarity into the second insulating film;
subsequently providing a second potential difference between the semiconductor layer and the gate electrode to inject charges having a second polarity opposite to the first polarity into the second insulating film; and subsequently providing a third potential difference between the semiconductor layer and the gate electrode to inject charges having the first polarity into the floating electrode.

2. The method according to claim 1, wherein
after providing the third potential difference between the semiconductor and the gate electrode,
a fourth potential difference is provided between the semiconductor layer and the gate electrode to inject charges having the second polarity into the second insulating film.

3. The method according to claim 1, wherein before providing the third potential difference between the semiconductor layer and the gate electrode, defects in a region in the second insulating film near the floating electrode are filled with the charges having the second polarity and defects in a remaining region in the second insulating film are filled with the charges having the first polarity.

4. The method according to claim 1, wherein at least any of the first insulating film and the second insulating film includes at least one selected from a group consisting of silicon oxide, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate.

5. The method according to claim 1, wherein an electric field applied to the first insulating film by the first potential difference and the second potential difference is 20 MV/cm or less.

6. The method according to claim 1, wherein an electric field applied to the first insulating film by the first potential difference and the second potential difference is 15 MV/cm or less, and application time of the electric field is 10 seconds or less.

7. The method according to claim 1, wherein the providing the first potential difference includes a plurality of providing potential differences to inject the charges having the first polarity into the second insulating film.

8. The method according to claim 1, wherein the providing of the second potential difference includes a plurality of providing potential differences to inject the charges having the second polarity into the second insulating film.

9. The method according to claim 1, wherein
the first polarity is negative,
the first potential difference is a potential difference such that the gate electrode has a higher potential than the semiconductor layer,
the second potential difference is a potential difference such that the gate electrode has a lower potential than the semiconductor layer, and
the third potential difference is a potential difference such that the gate electrode has a higher potential than the semiconductor layer.

10. The method according to claim 9, wherein before providing the third potential difference between the semiconductor layer and the gate electrode, defects in a region in the second insulating film near the floating electrode are filled with holes and defects in a remaining region in the second insulating film are filled with electrons.

11. The method according to claim 9, wherein
after providing the third potential difference between the semiconductor layer and the gate electrode,
a fourth potential difference is provided between the semiconductor layer and the gate electrode to inject the charges having the second polarity being positive into the second insulating film.

12. The method according to claim 1, wherein
the first polarity is positive,
the first potential difference is a potential difference such that the gate electrode has a lower potential than the semiconductor layer,
the second potential difference is a potential difference such that the gate electrode has a higher potential than the semiconductor layer, and
the third potential difference is a potential difference such that the gate electrode has a lower potential than the semiconductor layer.

13. The method according to claim 12, wherein before providing the third potential difference between the semiconductor layer and the gate electrode, defects in a region in the second insulating film near the floating electrode are filled with electrons and defects in a remaining region in the second insulating film are filled with holes.

14. The method according to claim 12, wherein
after providing the third potential difference between the semiconductor layer and the gate electrode,
a fourth potential difference between the semiconductor layer and the gate electrode to inject the charges having the second polarity being negative into the second insulating film.

15. A method for driving a nonvolatile semiconductor memory device having a semiconductor layer having a channel and source/drain regions provided on both sides of the channel, a first insulating film provided on the channel, a floating electrode provided on the first insulating film, a second insulating film provided on the floating electrode, and a gate electrode provided on the second insulating film, the nonvolatile semiconductor memory device changing its data memory state by injection of charges into the floating electrode,
the method comprising, to achieve a state in which charges having a first polarity are injected into the floating electrode:
providing a first potential difference between the semiconductor layer and the gate electrode to inject charges having the first polarity into the floating electrode; and
subsequently providing a second potential difference between the semiconductor layer and the gate electrode to inject charges having a second polarity opposite to the first polarity into the second insulating film.

16. The method according to claim 15, wherein providing the second potential difference between the semiconductor layer and the gate electrode injects the charges having the second polarity into a region of the second insulating film facing the floating electrode.

17. The method according to claim 15, wherein at least any of the first insulating film and the second insulating film includes at least one selected from a group consisting of silicon oxide, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate.

18. The method according to claim 15, wherein
the first polarity is negative,
the first potential difference is a potential difference such that the gate electrode has a higher potential than the semiconductor layer,
the second potential difference is a potential difference such that the gate electrode has a lower potential than the semiconductor layer.

19. The method according to claim 15, wherein
the first polarity is positive,
the first potential difference is a potential difference such that the gate electrode has a lower potential than the semiconductor layer,
the second potential difference is a potential difference such that the gate electrode has a higher potential than the semiconductor layer.

20. A nonvolatile semiconductor memory device comprising:
a semiconductor layer having a channel and source/drain regions provided on both sides of the channel;
a first insulating film provided on the channel;
a floating electrode provided on the first insulating film;
a second insulating film provided on the floating electrode;
a gate electrode provided on the second insulating film; and
a control circuit controlling its data memory state by injection of charges into the floating electrode,
the control circuit being configured to perform, to achieve a state in which charges having a first polarity are injected into the floating electrode:
providing a first potential difference between the semiconductor layer and the gate electrode to inject charges having the first polarity into the second insulating film;
subsequently providing a second potential difference between the semiconductor layer and the gate electrode to inject charges having a second polarity opposite to the first polarity into the second insulating film; and
subsequently providing a third potential difference between the semiconductor layer and the gate electrode to inject charges having the first polarity into the floating electrode.

21. A nonvolatile semiconductor memory device comprising:
a semiconductor layer having a channel and source/drain regions provided on both sides of the channel;
a first insulating film provided on the channel;
a floating electrode provided on the first insulating film;
a second insulating film provided on the floating electrode;
a gate electrode provided on the second insulating film; and
a control circuit controlling its data memory state by injection of charges into the floating electrode,
the control circuit being configured to perform, to achieve a state in which charges having a first polarity are injected into the floating electrode:
providing a first potential difference between the semiconductor layer and the gate electrode to inject charges having the first polarity into the floating electrode; and
subsequently providing a second potential difference between the semiconductor layer and the gate electrode to inject charges having a second polarity opposite to the first polarity into the second insulating film.

* * * * *